(12) United States Patent
Peri et al.

(10) Patent No.: US 9,984,963 B2
(45) Date of Patent: May 29, 2018

(54) COBALT-CONTAINING CONDUCTIVE LAYERS FOR CONTROL GATE ELECTRODES IN A MEMORY STRUCTURE

(71) Applicant: SANDISK TECHNOLOGIES LLC, Plano, TX (US)

(72) Inventors: Somesh Peri, San Jose, CA (US); Rahul Sharangpani, Fremont, CA (US); Raghuveer S. Makala, Campbell, CA (US); Senaka Kanakamedala, San Jose, CA (US); Keerti Shukla, Milpitas, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days. days.

(21) Appl. No.: 15/223,729

(22) Filed: Jul. 29, 2016

(65) Prior Publication Data

US 2016/0351497 A1    Dec. 1, 2016

Related U.S. Application Data

(63) Continuation-in-part of application No. 14/613,956, filed on Feb. 4, 2015.
(Continued)

(51) Int. Cl.
*H01L 23/522* (2006.01)
*H01L 27/1157* (2017.01)
(Continued)

(52) U.S. Cl.
CPC .... *H01L 23/5226* (2013.01); *H01L 21/76816* (2013.01); *H01L 21/76843* (2013.01);
(Continued)

(58) Field of Classification Search
None
See application file for complete search history.

(56) References Cited

U.S. PATENT DOCUMENTS 5,084,417 A    1/1992  Joshi et al.
5,583,360 A    12/1996 Roth et al.
(Continued)

FOREIGN PATENT DOCUMENTS

WO    WO2002/015277 A2    2/2002

OTHER PUBLICATIONS

First Chinese Office Action from State Intellectual Property Office for Chinese Application No. 201510175188.8, issued Apr. 19, 2017, with English-language translation, 19 pages.
(Continued)

*Primary Examiner* — Tom Thomas
*Assistant Examiner* — Nilufa Rahim
(74) *Attorney, Agent, or Firm* — The Marbury Law Group PLLC

(57) ABSTRACT

A memory stack structure including a memory film and a vertical semiconductor channel can be formed within each memory opening that extends through a stack including an alternating plurality of insulator layers and sacrificial material layers. After formation of backside recesses through removal of the sacrificial material layers selective to the insulator layers, a backside blocking dielectric layer is formed in the backside recesses and sidewalls of the memory stack structures. A metallic barrier material portion can be formed in each backside recess. A cobalt metal portion can be formed in each backside recess. Each backside recess can be filled with a portion of a backside blocking dielectric layer, a metallic barrier material portion, a cobalt metal portion, and a metallic material portion including a material other than cobalt.

17 Claims, 37 Drawing Sheets

Related U.S. Application Data

(60) Provisional application No. 62/300,221, filed on Feb. 26, 2016.

(51) Int. Cl.

| | | |
|---|---|---|
| H01L 27/11582 | (2017.01) | |
| H01L 27/11573 | (2017.01) | |
| H01L 27/11524 | (2017.01) | |
| H01L 27/11556 | (2017.01) | |
| H01L 23/528 | (2006.01) | |
| H01L 23/532 | (2006.01) | |
| H01L 21/768 | (2006.01) | |
| H01L 29/49 | (2006.01) | |
| H01L 29/66 | (2006.01) | |
| H01L 29/788 | (2006.01) | |
| H01L 29/792 | (2006.01) | |
| H01L 27/11526 | (2017.01) | |
| H01L 27/11548 | (2017.01) | |
| H01L 27/11575 | (2017.01) | |

(52) U.S. Cl.
CPC ...... *H01L 21/76877* (2013.01); *H01L 23/528* (2013.01); *H01L 23/53266* (2013.01); *H01L 27/1157* (2013.01); *H01L 27/11524* (2013.01); *H01L 27/11526* (2013.01); *H01L 27/11548* (2013.01); *H01L 27/11556* (2013.01); *H01L 27/11573* (2013.01); *H01L 27/11575* (2013.01); *H01L 27/11582* (2013.01); *H01L 29/4958* (2013.01); *H01L 29/4966* (2013.01); *H01L 29/66825* (2013.01); *H01L 29/66833* (2013.01); *H01L 29/7889* (2013.01); *H01L 29/7926* (2013.01)

(56) References Cited

U.S. PATENT DOCUMENTS

| | | | |
|---|---|---|---|
| 5,807,788 A | 9/1998 | Brodsky et al. | |
| 5,897,354 A | 4/1999 | Kachelmeier | |
| 5,915,167 A | 6/1999 | Leedy | |
| 6,238,978 B1 | 5/2001 | Huster | |
| 6,759,343 B2 | 7/2004 | Lee et al. | |
| 6,953,697 B1 | 10/2005 | Castle et al. | |
| 7,005,350 B2 | 2/2006 | Walker et al. | |
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,271,444 B2 | 9/2007 | Furukawa et al. | |
| 7,514,321 B2 | 4/2009 | Mokhlesi et al. | |
| 7,575,973 B2 | 8/2009 | Mokhlesi et al. | |
| 7,745,265 B2 | 6/2010 | Mokhlesi et al. | |
| 7,745,312 B2 | 6/2010 | Herner et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 7,875,922 B2 | 1/2011 | Arai et al. | |
| 8,008,710 B2 | 8/2011 | Fukuzumi et al. | |
| 8,008,722 B2 | 8/2011 | Kim et al. | |
| 8,187,936 B2 | 5/2012 | Alsmeier et al. | |
| 8,193,054 B2 | 6/2012 | Alsmeier | |
| 8,198,672 B2 | 6/2012 | Alsmeier | |
| 8,237,213 B2 | 8/2012 | Liu | |
| 8,283,228 B2 | 10/2012 | Alsmeier | |
| 8,349,681 B2 | 1/2013 | Alsmeier et al. | |
| 8,445,347 B2 | 5/2013 | Alsmeier | |
| 8,450,791 B2 | 5/2013 | Alsmeier | |
| 8,461,000 B2 | 6/2013 | Alsmeier et al. | |
| 8,569,827 B2 | 10/2013 | Lee et al. | |
| 8,580,639 B2 | 11/2013 | Alsmeier et al. | |
| 8,765,543 B2 | 7/2014 | Alsmeier et al. | |
| 8,829,591 B2 | 9/2014 | Alsmeier | |
| 8,847,302 B2 | 9/2014 | Alsmeier et al. | |
| 8,928,061 B2 | 1/2015 | Chien et al. | |
| 8,946,810 B2 | 2/2015 | Alsmeier | |
| 9,023,719 B2 | 5/2015 | Pachamuthu et al. | |
| 9,159,739 B2 | 10/2015 | Makala et al. | |
| 9,165,940 B2 | 10/2015 | Chien et al. | |
| 9,230,976 B2 | 1/2016 | Alsmeier | |
| 2007/0210338 A1 | 9/2007 | Orlowski | |
| 2007/0252201 A1 | 11/2007 | Kito et al. | |
| 2008/0173928 A1 | 7/2008 | Arai et al. | |
| 2009/0053426 A1* | 2/2009 | Lu | C23C 16/16 427/540 |
| 2009/0283819 A1 | 11/2009 | Ishikawa et al. | |
| 2009/0294828 A1 | 12/2009 | Ozawa et al. | |
| 2010/0044778 A1 | 2/2010 | Seol et al. | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho et al. | |
| 2010/0163968 A1 | 7/2010 | Kim et al. | |
| 2010/0181610 A1 | 7/2010 | Kim et al. | |
| 2010/0207195 A1 | 8/2010 | Fukuzumi et al. | |
| 2010/0213527 A1 | 8/2010 | Shim et al. | |
| 2010/0320528 A1 | 12/2010 | Jeong et al. | |
| 2011/0076819 A1 | 3/2011 | Kim et al. | |
| 2011/0133606 A1 | 6/2011 | Yoshida et al. | |
| 2011/0266606 A1 | 11/2011 | Park et al. | |
| 2012/0001247 A1 | 1/2012 | Alsmeier | |
| 2012/0012921 A1 | 1/2012 | Liu | |
| 2013/0237024 A1 | 9/2013 | Alsmeier et al. | |
| 2013/0248974 A1 | 9/2013 | Alsmeier et al. | |
| 2013/0264631 A1 | 10/2013 | Alsmeier et al. | |
| 2013/0313627 A1 | 11/2013 | Lee et al. | |
| 2014/0008714 A1 | 1/2014 | Makala et al. | |
| 2014/0045307 A1 | 2/2014 | Alsmeier et al. | |
| 2014/0131787 A1 | 5/2014 | Alsmeier | |
| 2014/0175530 A1 | 6/2014 | Chien et al. | |
| 2014/0203346 A1* | 7/2014 | Lee | H01L 29/7926 257/324 |
| 2014/0225181 A1 | 8/2014 | Makala et al. | |
| 2014/0252452 A1 | 9/2014 | Alsmeier | |
| 2014/0353738 A1 | 12/2014 | Makala et al. | |
| 2014/0361360 A1 | 12/2014 | Alsmeier et al. | |
| 2015/0072488 A1 | 3/2015 | Chien et al. | |
| 2015/0076584 A1 | 3/2015 | Pachamuthu et al. | |
| 2015/0115348 A1* | 4/2015 | Nam | H01L 27/11582 257/324 |
| 2015/0171099 A1 | 6/2015 | Alsmeier | |
| 2015/0179660 A1 | 6/2015 | Yada et al. | |
| 2015/0179662 A1 | 6/2015 | Makala et al. | |
| 2015/0318301 A1* | 11/2015 | Lee | H01L 29/7926 257/324 |
| 2015/0364488 A1 | 12/2015 | Pachamuthu et al. | |
| 2016/0104720 A1 | 4/2016 | Alsmeier | |
| 2016/0111434 A1 | 4/2016 | Pachamuthu et al. | |

OTHER PUBLICATIONS

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

(56) References Cited

OTHER PUBLICATIONS

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.
International Search Report & Written Opinion, PCT/US2011/042566, dated Jan. 17, 2012.
Invitation to Pay Additional Fees and Partial International Search Report, PCT/US2011/042566, dated Sep. 28, 2011.
Endoh et al., "Novel Ultra High Density Memory with a Stacked-Surrounding Gate Transistor (S-SGT) Structured Cell," IEDM Proc., (2001), 33-36.
Katsumata et al., "Pipe-shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-shaped BiCS Flash Memory," 2009 Symposium on VLSI Technology Digest of Technical Papers, pp. 22-23.
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
International Preliminary Report on Patentability, PCT/US2011/042566, dated Jan. 17, 2013.
Au et al., "Filling Narrow Trenches by Iodine-Catalyzed CVD of Copper and Manganese on Manganese Nitride Barrier/Adhesion Layers," Journal of the Electrochemical Society, 158(5) (2011).
Kim et al., "Direct Copper Electroless Deposition on a Tungsten Barrier Layer for Ultralarge Scale Integration," Journal of the Electrochemical Society, vol. 152, Issue 2, 2005.
European Patent Office Communication Article 94(3), EP Application No. 11745848.9, dated May 12, 2015.
U.S. Appl. No. 14/687,403, filed Apr. 15, 2015, Sandisk Technologies LLC.
U.S. Appl. No. 14/859,710, filed Sep. 21, 2015, Sandisk Technologies LLC.
U.S. Appl. No. 15/056,465, filed Feb. 29, 2016, Sandisk Technologies LLC.
International Preliminary Report on Patentability and Written Opinion of the International Searching Authority for International Patent Application No. PCT/US2015/045205, dated Mar. 2, 2017, 12 pages.
Wang, Shi-Qing, "Barriers Against Copper Diffusion into Silicon and Drift Through Silicon Dioxide," Abstract of MRS Bulletin, vol. 19, Issue 8, pp. 30-40, (1994).
Second Chinese Office Action from State Intellectual Property Office for Chinese Application No. 201510175188.8, dated Nov. 16, 2017, with English-language translation, 8 pages.

\* cited by examiner

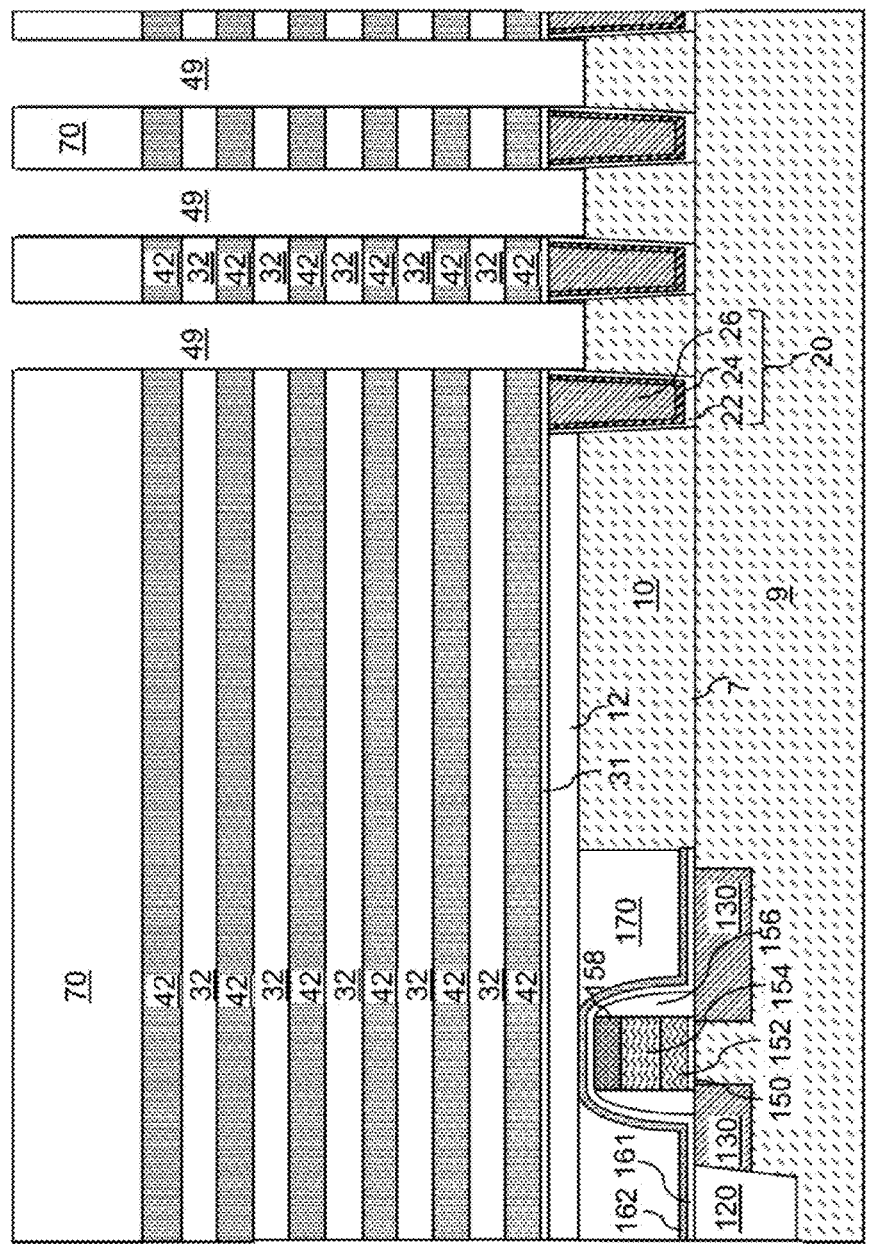

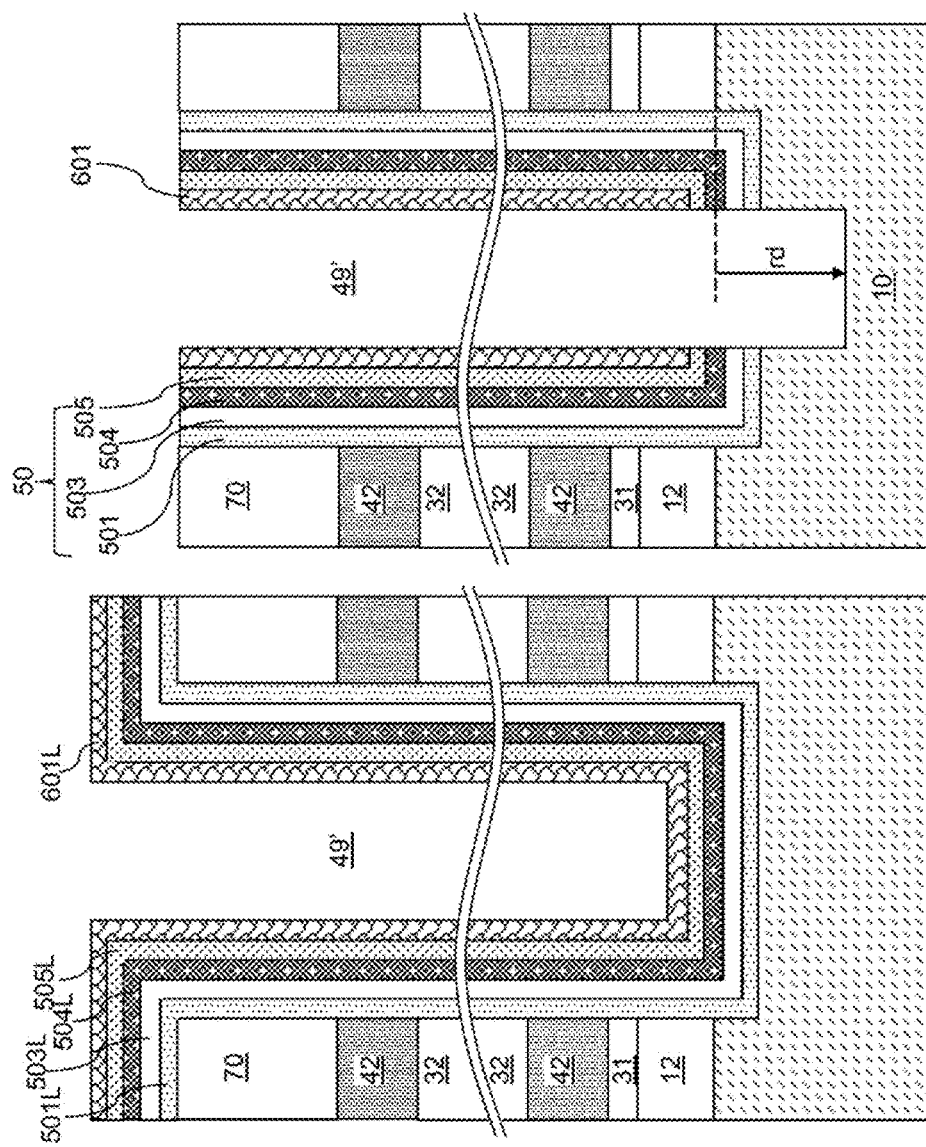

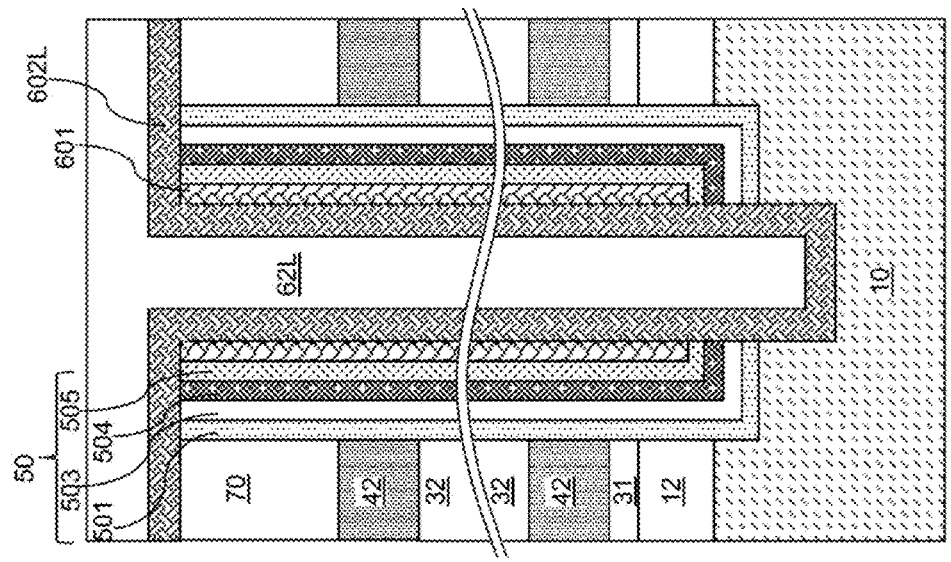
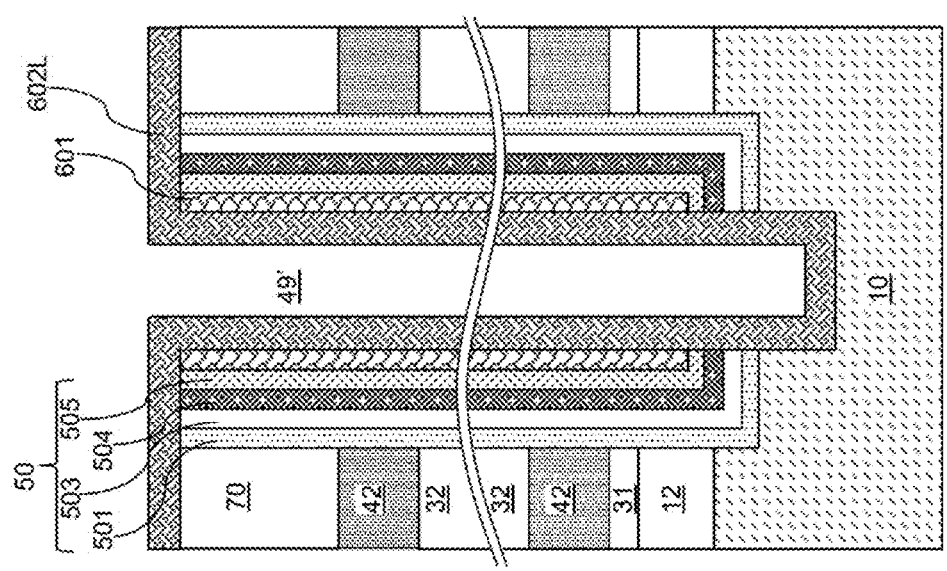

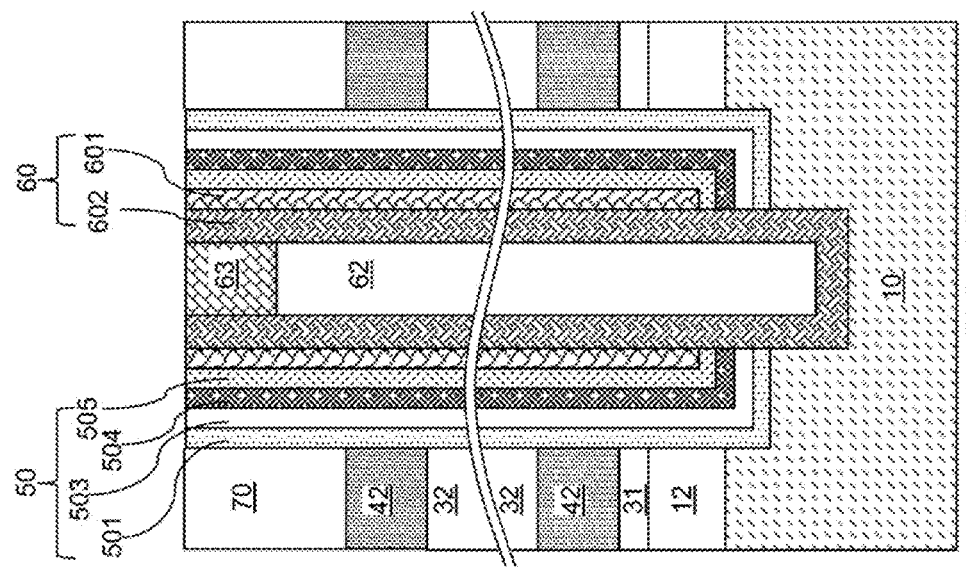
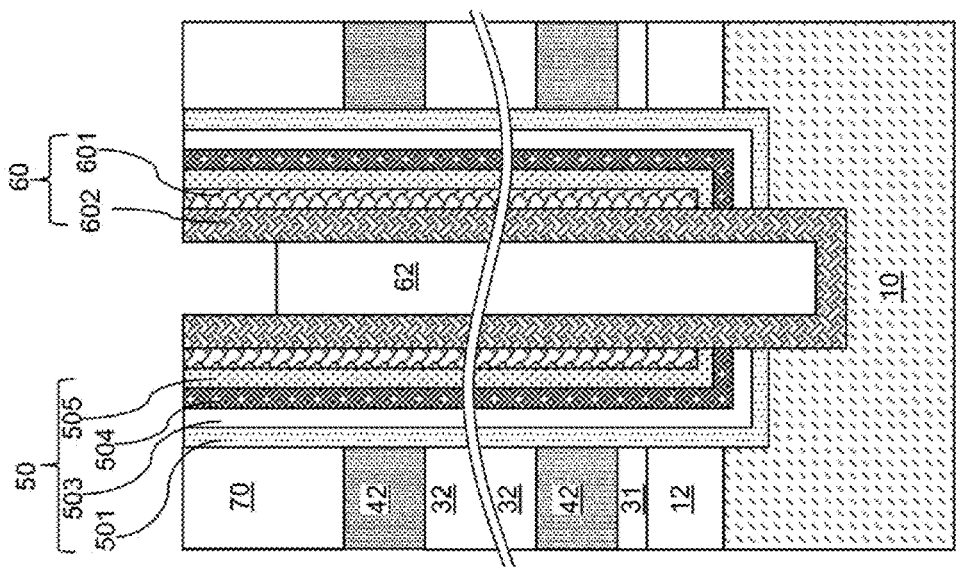

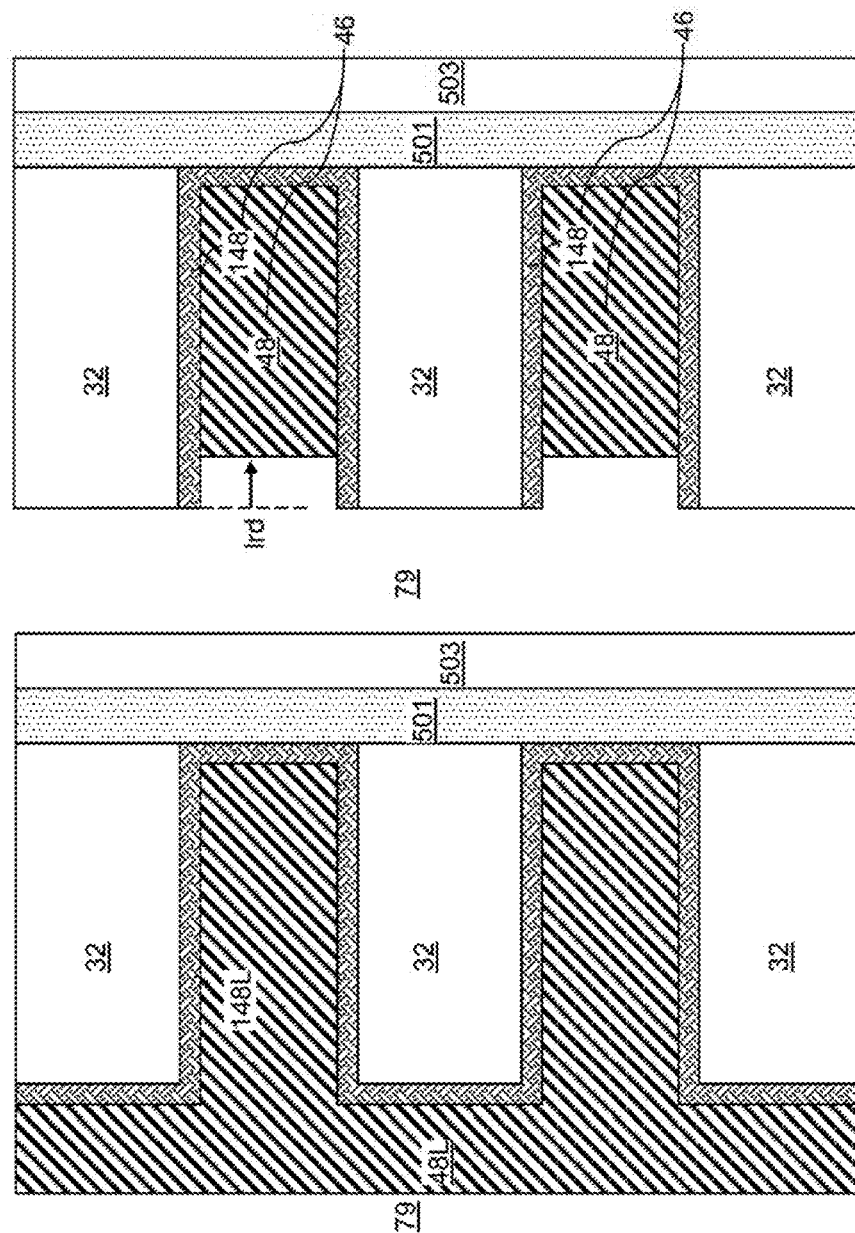

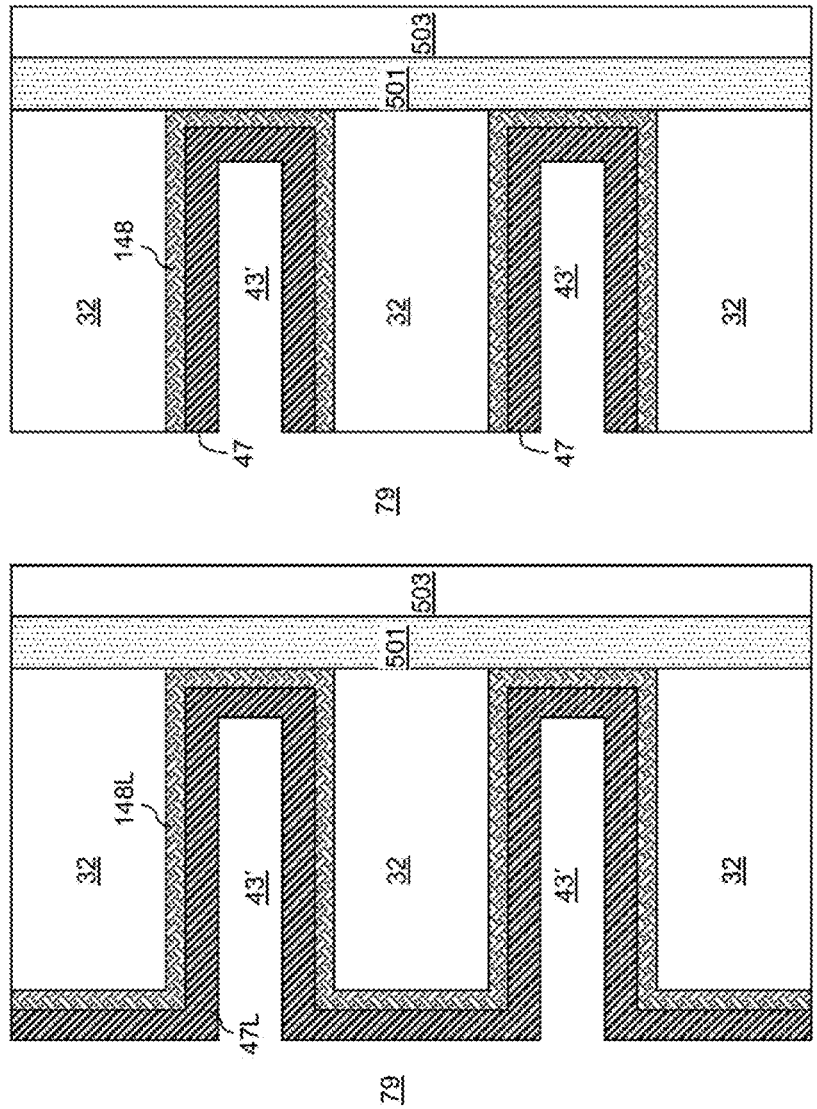

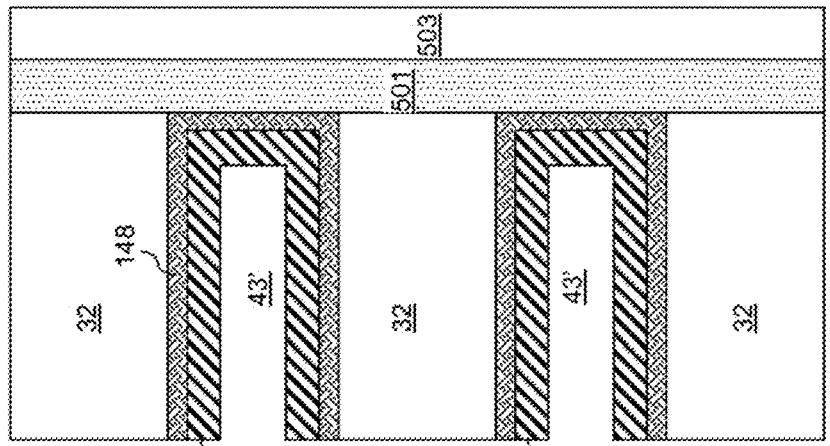
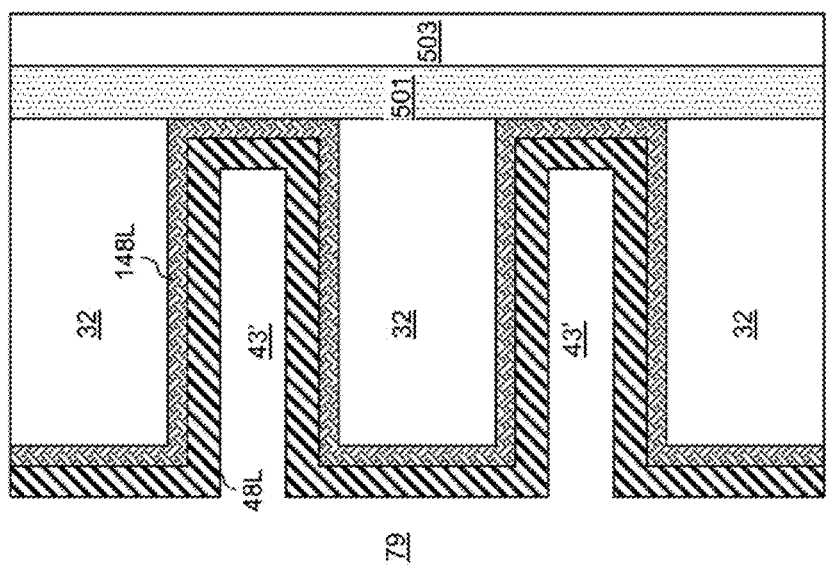
FIG. 11B
FIG. 11A

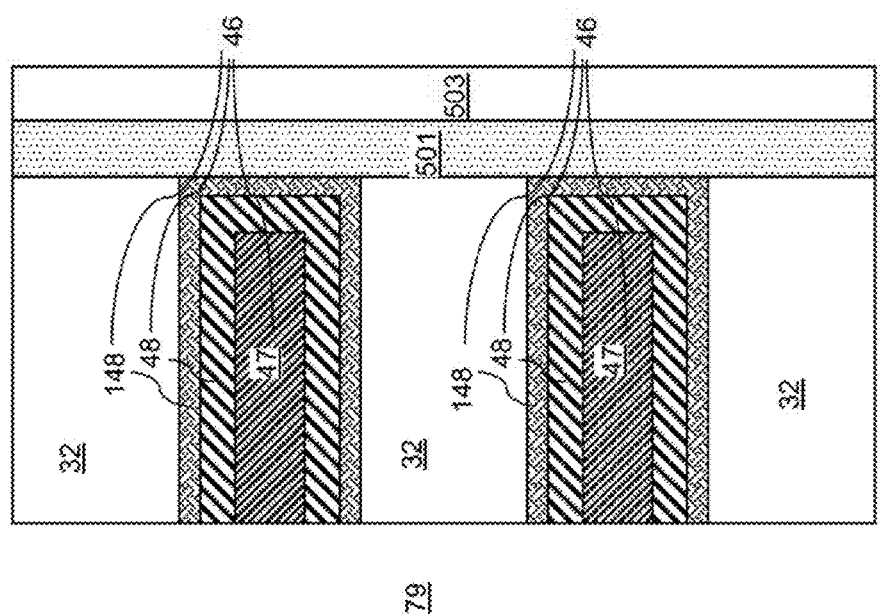

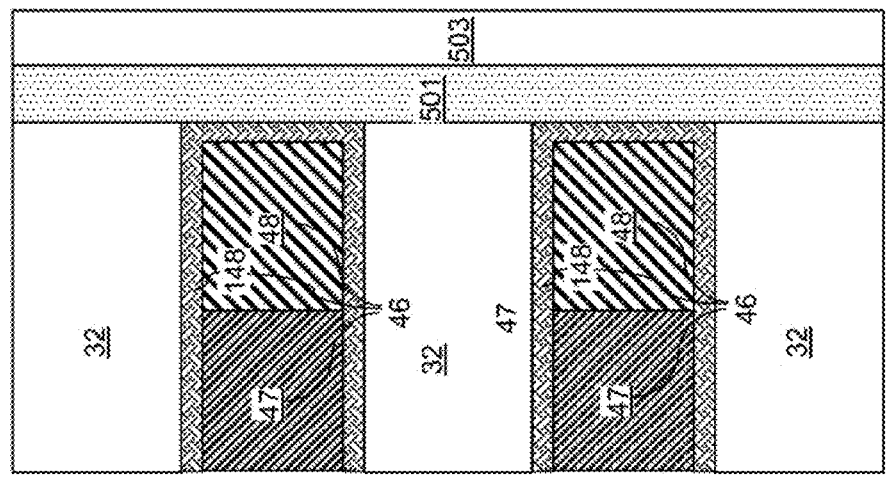

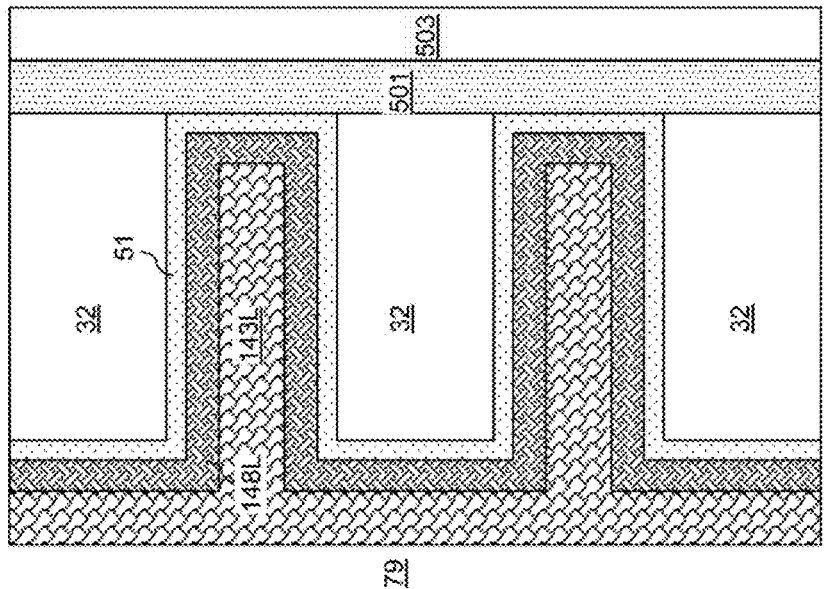
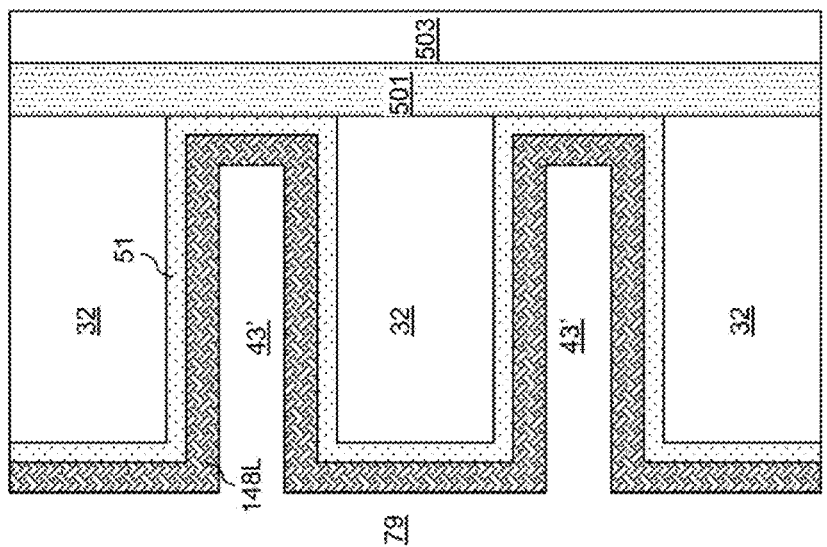

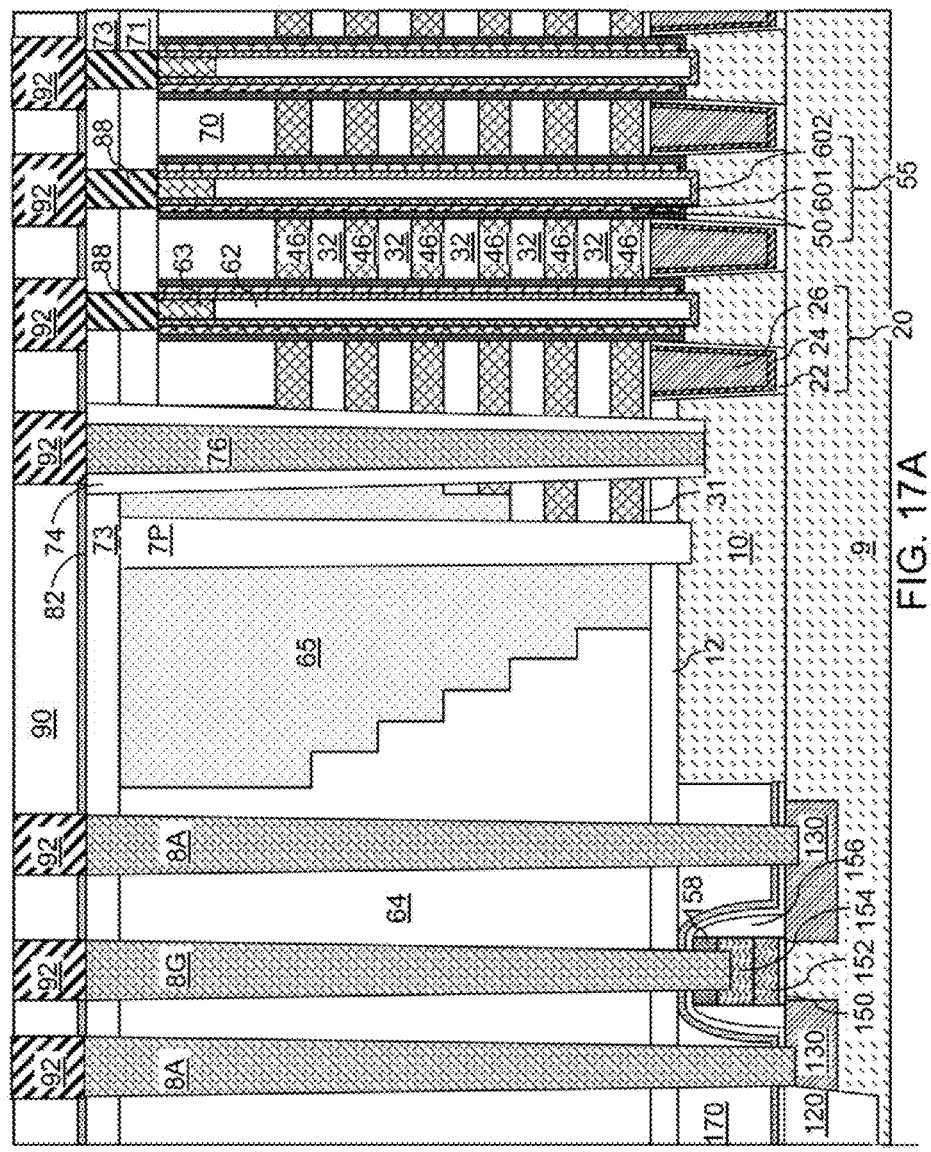

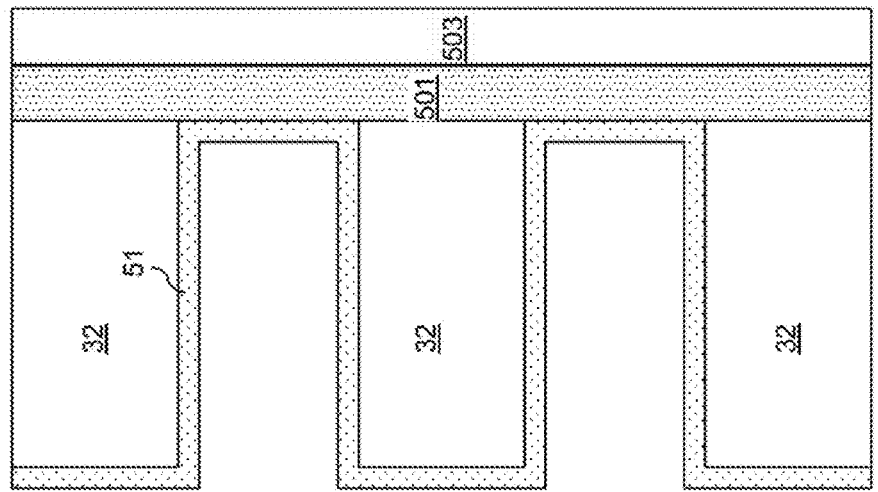
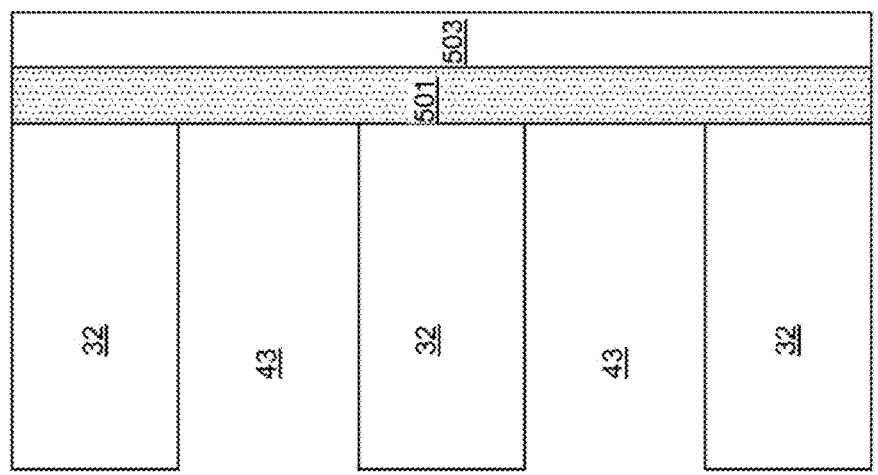

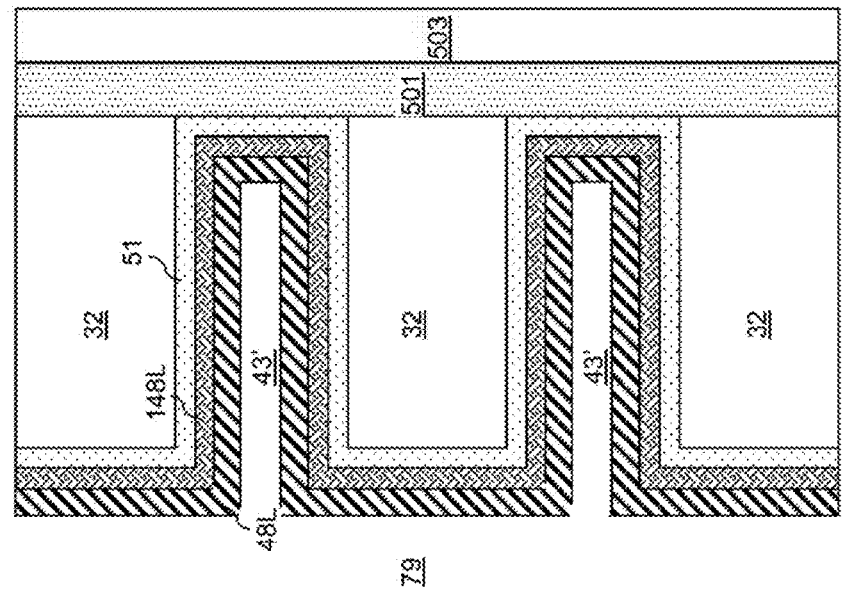
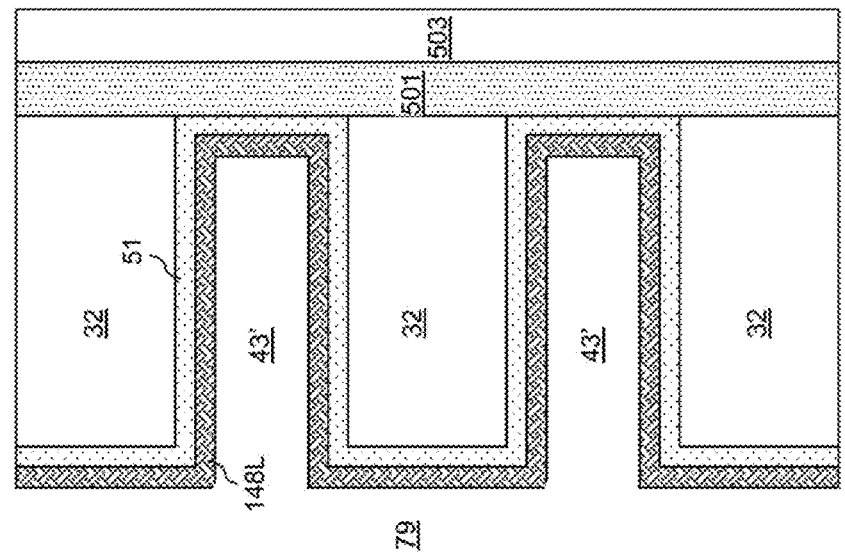

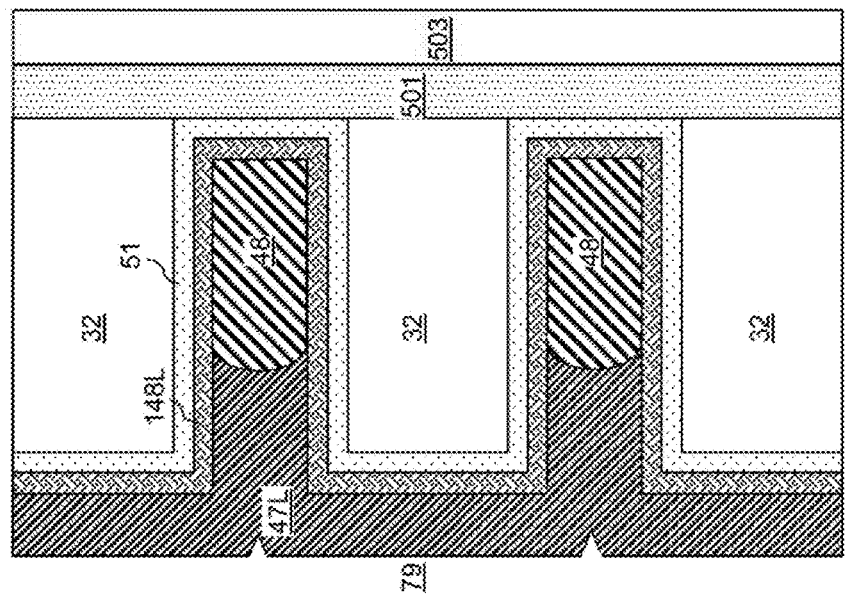
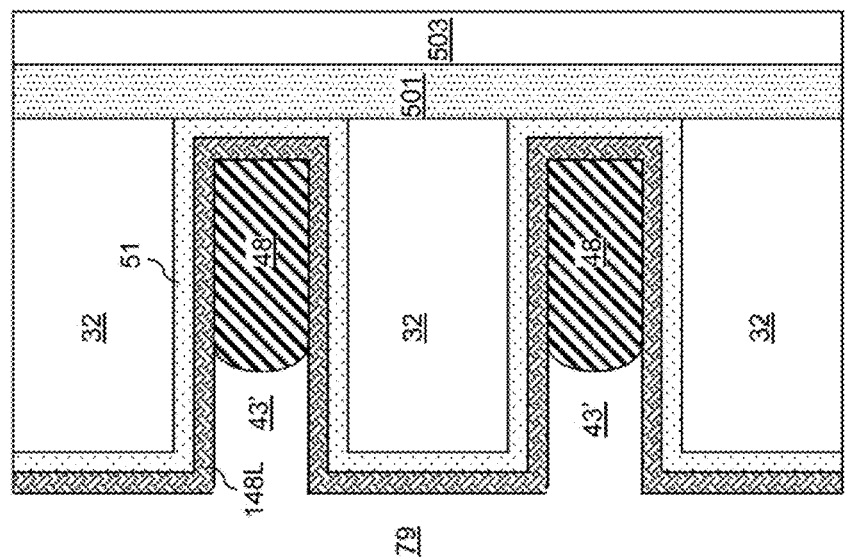

COBALT-CONTAINING CONDUCTIVE LAYERS FOR CONTROL GATE ELECTRODES IN A MEMORY STRUCTURE

CROSS REFERENCE TO RELATED APPLICATIONS

The present application is a continuation-in-part of U.S. application Ser. No. 14/613,956, filed Feb. 4, 2015. The present application also claims benefit of priority of U.S. Provisional Application Ser. No. 62/300,221, filed on Feb. 26, 2016. All of the priority applications are incorporated herein by reference in their entirety.

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: a stack of alternating layers comprising insulator layers and electrically conductive layers and located over a substrate; a memory opening extending through the stack; and a memory stack structure comprising at least one charge storage element, a tunneling dielectric, and a vertical semiconductor channel and is located within the memory opening. Each of the electrically conductive layers comprises at least a cobalt metal portion and a metallic material portion containing a material other than cobalt and contacting the cobalt metal portion.

According to another aspect of the present disclosure, a method of manufacturing a three-dimensional memory device is provided. A stack of alternating layers comprising insulator layers and sacrificial material layers is formed over a substrate. A memory opening is formed through the stack. A memory stack structure comprising at least one charge storage element, a tunneling dielectric, and a vertical semiconductor channel is formed within the memory opening. Backside recesses are formed by removing the sacrificial material layers selective to the insulator layers, and electrically conductive layers are formed within the backside recesses. Each of the electrically conductive layers is formed by forming at least a cobalt metal portion and a metallic material portion containing a material other than cobalt and contacting the cobalt metal portion within a respective backside recess.

According to an aspect of the present disclosure, a three-dimensional memory device is provided, which comprises a stack of alternating layers comprising insulator layers and electrically conductive layers and located over a substrate, a memory opening extending through the stack, and a memory film and a semiconductor channel located within the memory opening. Each of the electrically conductive layers comprises a cobalt portion.

According to an aspect of the present disclosure, a three-dimensional memory device is provided, which comprises a stack of alternating layers comprising insulator layers and electrically conductive layers and located over a substrate, an opening extending through the stack, a blocking dielectric, at least one charge storage element and a tunneling dielectric located within the opening, and a semiconductor channel located within the opening. Each of the electrically conductive layers comprises at least a cobalt portion.

According to another aspect of the present disclosure, a method of manufacturing a three-dimensional memory device is provided. A stack of alternating layers comprising insulator layers and sacrificial material layers is formed over a substrate. A memory opening is formed through the stack. A memory film and a semiconductor channel are formed in the memory opening. Backside recesses are formed around the memory film by removing the sacrificial material layers. Electrically conductive layers are formed within the backside recesses. Each of the electrically conductive layers is formed by forming at least a cobalt portion within a respective backside recess.

BRIEF DESCRIPTION OF THE DRAWINGS

FIG. 1 is a vertical cross-sectional view of an exemplary structure after formation of a stack including an alternating plurality of material layers and memory openings extending through the stack according to an embodiment of the present disclosure.

FIGS. 2A-2F are sequential vertical cross-sectional views of a memory opening within the exemplary structure during various processing steps employed to form a memory stack structure according to an embodiment of the present disclosure.

FIGS. 7A and 7B are sequential vertical cross-sectional views of a magnified region M in FIGS. 5A and 5B during formation of second exemplary electrically conductive layers according to a second embodiment of the present disclosure.

FIGS. 8A-8C are sequential vertical cross-sectional views of a magnified region M in FIGS. 5A and 5B during formation of third exemplary electrically conductive layers according to a third embodiment of the present disclosure.

FIGS. 11A-11C are sequential vertical cross-sectional views of a magnified region M in FIGS. 5A and 5B during formation of sixth exemplary electrically conductive layers according to a sixth embodiment of the present disclosure.

FIGS. 12A-12C are sequential vertical cross-sectional views of a magnified region M in FIGS. 5A and 5B during formation of seventh exemplary electrically conductive layers according to a seventh embodiment of the present disclosure.

FIGS. 14A-14E are sequential vertical cross-sectional views of a magnified region M in FIGS. 5A and 5B during formation of ninth exemplary electrically conductive layers according to a ninth embodiment of the present disclosure.

FIGS. 17A and 17B are vertical cross-sectional views of regions of the exemplary structure after formation of conductive line structures according to an embodiment of the present disclosure.

FIGS. 18A-18F are sequential vertical cross-sectional views of a magnified region M in FIGS. 5A and 5B during formation of tenth exemplary electrically conductive layers according to an embodiment of the present disclosure.

FIGS. 19A-19C are sequential vertical cross-sectional views of a magnified region M in FIGS. 5A and 5B during formation of eleventh exemplary electrically conductive layers according to an embodiment of the present disclosure.

DETAILED DESCRIPTION

Figure 3:
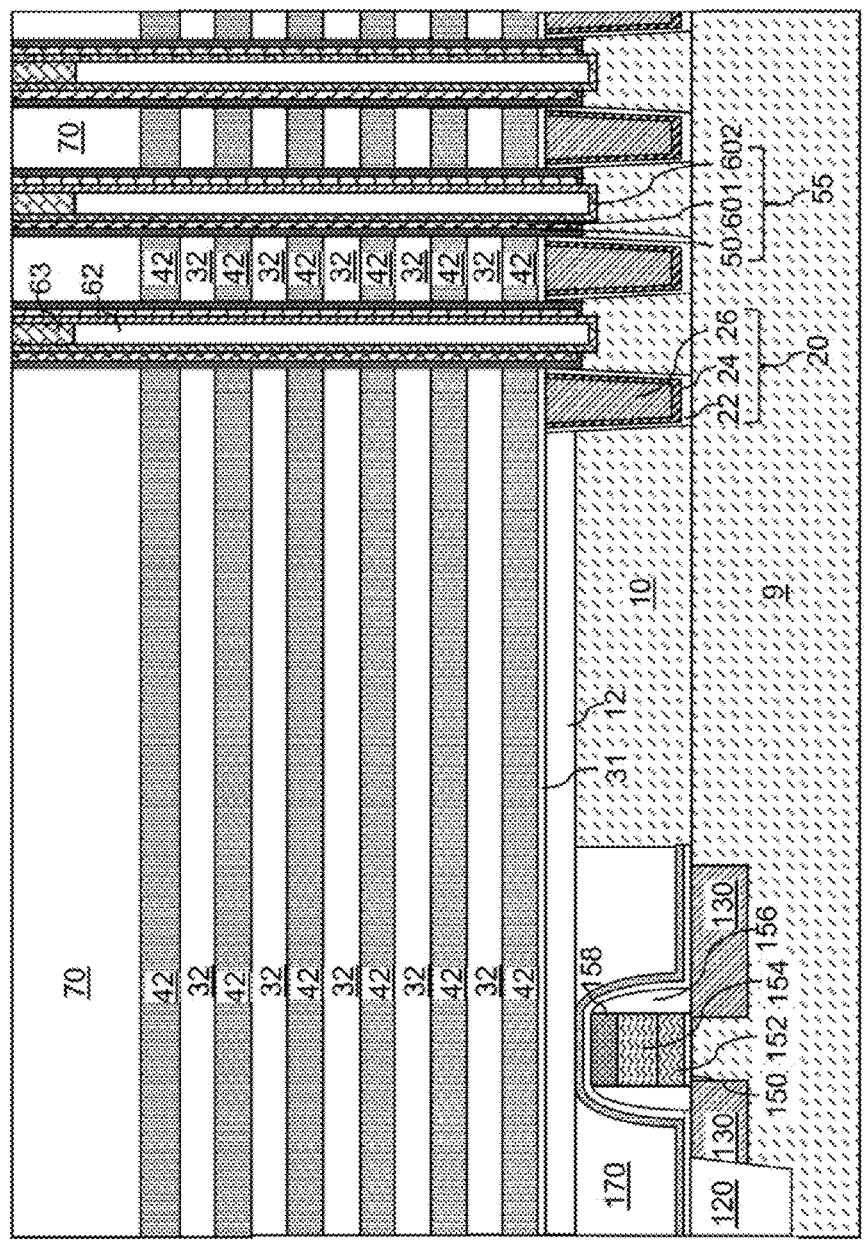
FIG. 3 is a vertical cross-sectional view of the exemplary structure after formation of memory stack structures according to an embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Tungsten is widely employed for the material of conductive metal lines. The inventors of the present disclosure recognized that high tensile stress generated by tungsten can generate warpage of a device structure. Further, the inventors of the present disclosure recognized that cobalt is a softer metal than tungsten, and may be deposited employing a thinner metallic barrier material layer than a metallic barrier metal layer required for tungsten deposition. Use of a thinner metallic barrier material layer for cobalt deposition relative to tungsten deposition is possible because cobalt can be deposited employing precursor gases that do not contain fluorine. For example, bis(cyclopentadienyl)cobalt, bis(ethylcyclopentadienyl)cobalt, bis(ethylcyclopentadienyl)cobalt, or bis(pentamethylcyclopentadienyl)cobalt may be employed to deposit cobalt. In addition, cobalt has a bulk resistivity of 6.24 µOhm-cm, which is comparable with the bulk resistivity of tungsten of 5.28 µOhm-cm. As the thickness of conductive metal layers decreases, therefore, it is possible to provide a metal interconnect structure having a lesser or comparable total resistance employing a combination of a thinner metallic barrier layer and a cobalt portion than a combination of a thicker metallic barrier layer and a tungsten portion.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface.

In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The semiconductor device can include, for example, field effect transistor(s). For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 70 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

At least one optional shallow trench can be formed through the dielectric pad layer 12 and an upper portion of the semiconductor material layer 10. The pattern of the at least one shallow trench can be selected such that lower select gate electrodes can be subsequently formed therein. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

A lower select gate structure 20 can be formed in each of the at least one shallow trench, for example, by forming a gate dielectric layer and at least one conductive material layer, and removing portions of the gate dielectric layer and the at least one conductive material layer from above the top surface of the dielectric pad layer 12, for example, by chemical mechanical planarization. Each lower select gate structure 20 can include a gate dielectric 22 and a gate electrode (24, 26). In one embodiment, each gate electrode (24, 26) can include an electrically conductive liner 24 and a conductive material portion 26. The electrically conductive liner 24 can include, for example, TiN, TaN, WN, or a combination thereof. The conductive material portion 26 can include, for example, W, Al, Cu, or combinations thereof. At least one optional shallow trench isolation structure (not shown) and/or at least one deep trench isolation structure (not shown) may be employed to provide electrical isolation among various semiconductor devices that are present, or are to be subsequently formed, on the substrate.

A dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

A stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a sacrificial material layer. In this case, the stack can include an alternating plurality of insulator layers 32 and sacrificial material layers 42.

The stack of the alternating plurality is herein referred to as an alternating stack (32, 42). In one embodiment, the alternating stack (32, 42) can include insulator layers 32 composed of the first material, and sacrificial material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an electrically insulating material, a semiconductor material, or a conductive material. The second material of the sacrificial material layers 42 can be subsequently replaced with electrically conductive electrodes, which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including at least one of silicon and germanium.

In one embodiment, the insulator layers 32 can include silicon oxide, and sacrificial material layers can include silicon nitride sacrificial material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulator layers 32 as described above. The insulating cap layer 70 can have a greater thickness than each of the insulator layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the unrecessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2F illustrate sequential vertical cross-sectional views of a memory opening within the exemplary structure during formation of an exemplary memory stack structure according to a first embodiment of the present disclosure. Formation of the exemplary memory stack structure can be performed within each of the memory openings 49 in the exemplary structure illustrated in FIG. 1.

Referring to FIG. 2A, a memory opening 49 is illustrated. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

A series of layers including at least one blocking dielectric layer (501L, 503L), a memory material layer 504L, a tunneling dielectric layer 505L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

The first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

The memory material layer 504L, the tunneling dielectric layer 505L, and the optional first semiconductor channel layer 601L can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 505L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 505L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 505L can include a stack of a first silicon oxide layer, a silicon oxynitride layer, and a second silicon oxide layer, which is commonly known as an ONO stack. In one embodiment, the tunneling dielectric layer 505L can include a silicon oxide layer that is substantially free of carbon or a silicon oxynitride layer that is substantially free of carbon. The thickness of the tunneling dielectric layer 505L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 5051, 601L).

Referring to FIG. 2B, the optional first semiconductor channel layer 601L, the tunneling dielectric layer 505L, the memory material layer 504L, the at least one blocking dielectric layer (501L, 503L) are sequentially anisotropically etched employing at least one anisotropic etch process. The portions of the first semiconductor channel layer 601L, the tunneling dielectric layer 505L, the memory material layer 504L, and the at least one blocking dielectric layer (501L, 503L) located above the top surface of the insulating cap layer 70 can be removed by the at least one anisotropic etch process. Further, the horizontal portions of the first semiconductor channel layer 601L, the tunneling dielectric layer 505L, the memory material layer 504L, and the at least one blocking dielectric layer (501L, 503L) at a bottom of each cavity 49' can be removed to form openings in remaining portions thereof. Each of the first semiconductor channel layer 601L, the tunneling dielectric layer 505L, the memory material layer 504L, and the at least one blocking dielectric layer (501L, 503L) can be etched by anisotropic etch process.

Each remaining portion of the first semiconductor channel layer 601L constitutes a first semiconductor channel portion 601. Each remaining portion of the tunneling dielectric layer 505L constitutes a tunneling dielectric 505. Each remaining portion of the memory material layer 504L is herein referred to as a charge storage element (e.g., a charge storage structure) 504. In one embodiment, the charge storage element 504 can be a contiguous layer, i.e., can be a charge storage layer. Each remaining portion of the second blocking dielectric layer 503L is herein referred to as a second blocking dielectric 503. Each remaining portion of the first blocking dielectric layer 501L is herein referred to as a first blocking dielectric 501. A surface of the semiconductor material layer 10 can be physically exposed underneath the opening through the first semiconductor channel portion 601, the tunneling dielectric 505, the charge storage element 504, and the at least one blocking dielectric (501, 503). Optionally, the physically exposed semiconductor surface at the bottom of each cavity 49' can be vertically recessed so that the recessed semiconductor surface underneath the cavity 49' is vertically offset from the topmost surface of the semiconductor material layer 10 by a recess distance rd. A tunneling dielectric 505 is embedded within a charge storage element 504. The charge storage element 504 can comprise a charge trapping material or a floating gate material.

In one embodiment, the first semiconductor channel portion 601, the tunneling dielectric 505, the charge storage element 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2C, a second semiconductor channel layer 602L can be deposited directly on the semiconductor surface of the semiconductor material layer 10 in the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2D, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2E, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 505 is embedded within a charge storage element 504, and laterally surrounds a portion of the semiconductor channel 60. Each adjoining set of a first blocking dielectric 501, a second blocking dielectric 503, a charge storage element 504, and a tunneling dielectric 505 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Referring to FIG. 2F, drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

The exemplary memory stack structure can be embedded into the exemplary structure illustrated in FIG. 1. FIG. 3 illustrates the exemplary structure that incorporates multiple instances of the exemplary memory stack structure of FIG. 2F. The exemplary structure includes a semiconductor device, which comprises a stack (32, 42) including an alternating plurality of material layers (e.g., the sacrificial material layers 42) and insulator layers 32 located over a semiconductor substrate (9, 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 4:
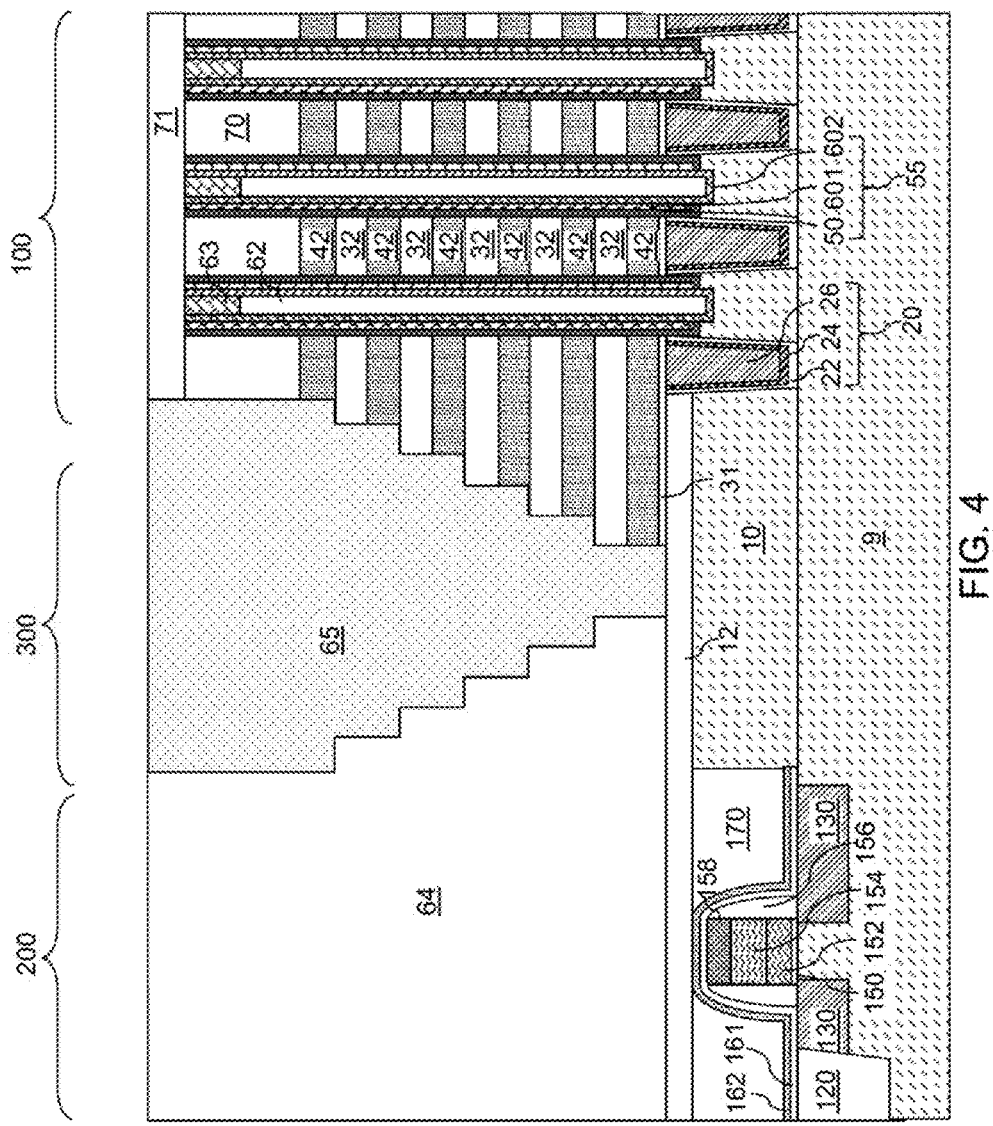
FIG. 4 is a vertical cross-sectional view of the exemplary structure after formation of a set of stepped surfaces and a retro-stepped dielectric material portion according to an embodiment of the present disclosure.

Referring to FIG. 4, at least one dielectric cap layer 71 can be optionally formed over the planarization dielectric layer 70. In one embodiment, the at least one dielectric cap layer 71 can include dielectric materials through which deuterium atoms can permeate. For example, the at least one dielectric cap layer can include silicon oxide and/or a dielectric metal oxide.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the at least one dielectric cap layer 71 by a planarization process such as chemical mechanical planarization and/or a recess etch. The top surfaces of the at least one dielectric cap layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the at least one dielectric cap layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
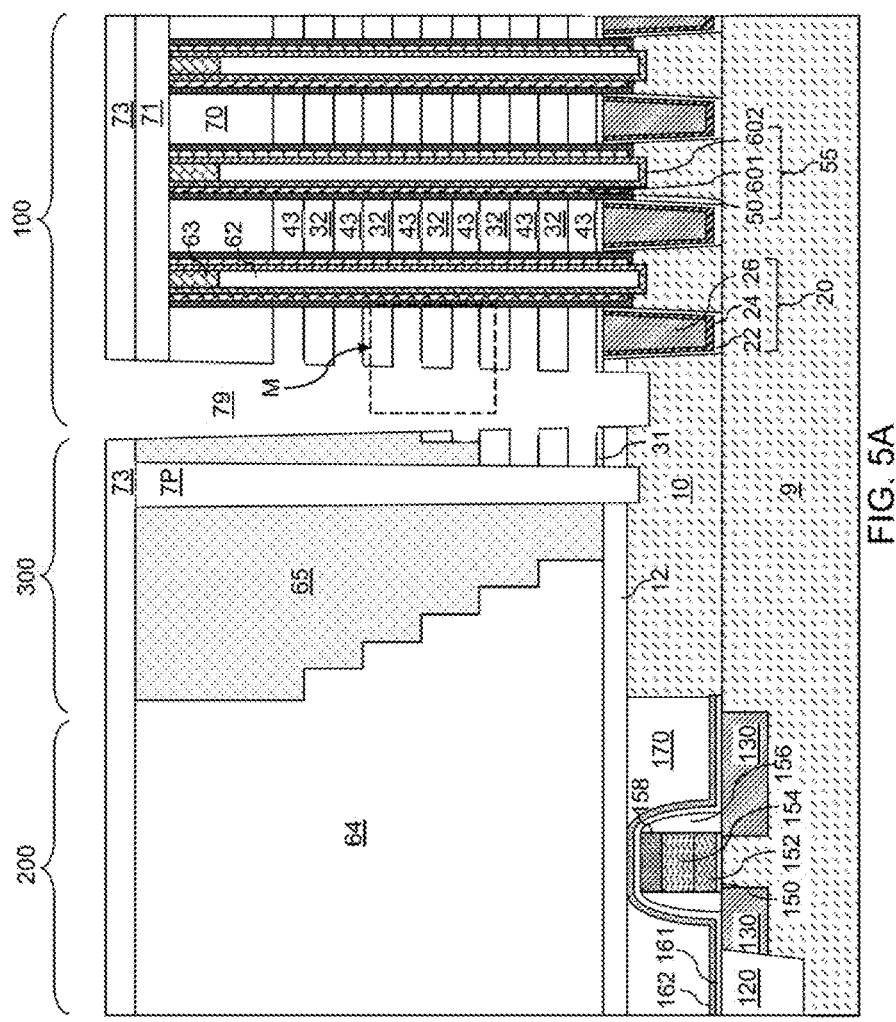
FIG. 5A is a vertical cross-sectional view of the exemplary structure after formation of a backside via cavity and backside recesses according to an embodiment of the present disclosure.
Figure 5B:
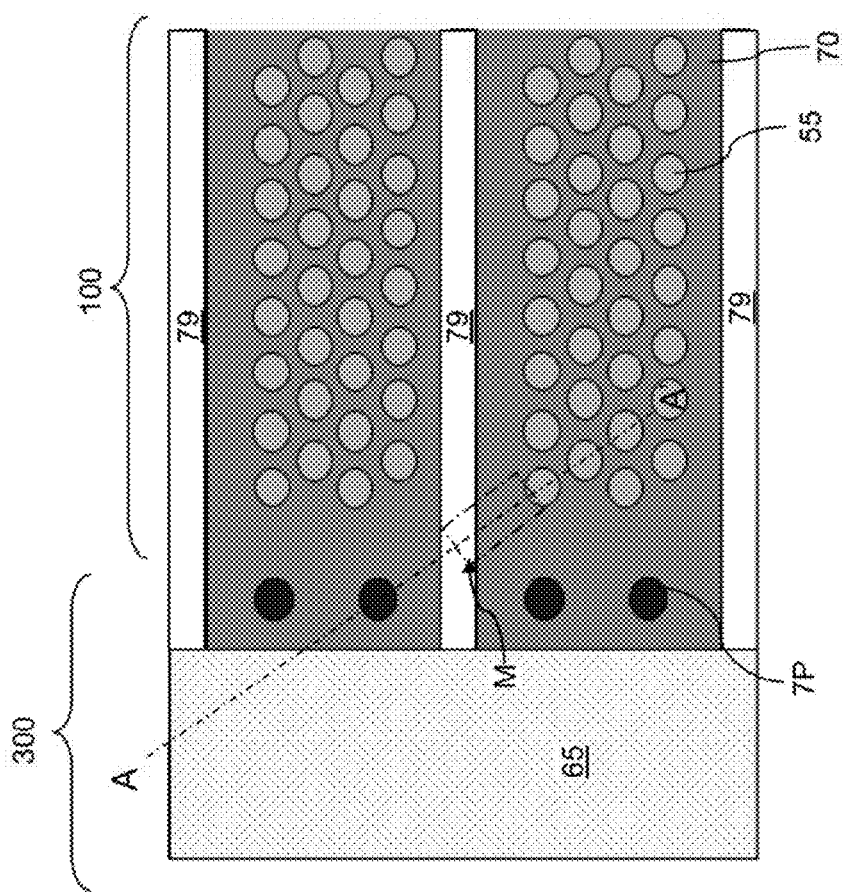
FIG. 5B is a see-through top-down view of the exemplary structure of FIG. 5A. The vertical plane A-A' is the plane of the vertical cross-sectional view of FIG. 5A.

Referring to FIGS. 5A and 5B, at least one dielectric support pillar 7P may be optionally formed through the retro-stepped dielectric material portion 65 and/or through the alternating stack (32, 42). The plane A-A' in FIG. 5B corresponds to the plane of the vertical cross-sectional view of FIG. 5A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42. In one embodiment, the at least one dielectric support pillar can include silicon oxide and/or a dielectric metal oxide such as aluminum oxide. In one embodiment, the portion of the dielectric material that is deposited over the at least one dielectric cap layer 71 concurrently with deposition of the at least one dielectric support pillar 7P can be present over the at least one dielectric cap layer 71 as a dielectric pillar material layer 73. The dielectric pillar material layer 73 and the at least one dielectric support pillar 7P can be formed as a single contiguous structure of integral construction, i.e., without any material interface therebetween. In another embodiment, the portion of the dielectric material that is deposited over the at least one dielectric cap layer 71 concurrently with deposition of the at least one dielectric support pillar 7P can be removed, for example, by chemical mechanical planarization or a recess etch. In this case, the dielectric pillar material layer 73 is not present, and the top surface of the at least one dielectric cap layer 71 can be physically exposed.

A photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. If desired, a source region (not shown) may be formed by implantation of dopant atoms into a portion of the semiconductor material layer 10 through the backside contact trench 79.

An etchant that selectively etches the second material of the sacrificial material layers 42 with respect to the first material of the insulator layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulator layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulator layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulator layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulator layer 32 and a bottom surface of an overlying insulator layer 32. In one embodiment, each backside recess 43 can have a uniform height throughout. Optionally, a backside blocking dielectric layer can be formed in the backside recesses.

Figure 6B:
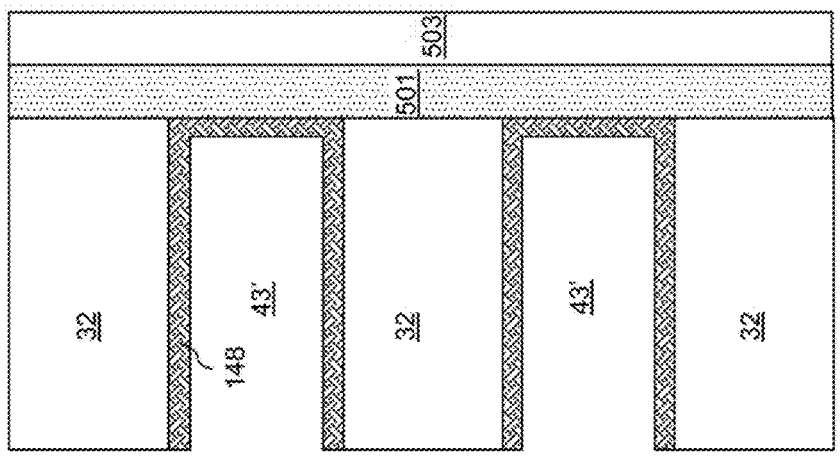
FIGS. 6A-6D are sequential vertical cross-sectional views of a magnified region M in FIGS. 5A and 5B during formation of first exemplary electrically conductive layers according to a first embodiment of the present disclosure.
Figure 6A:
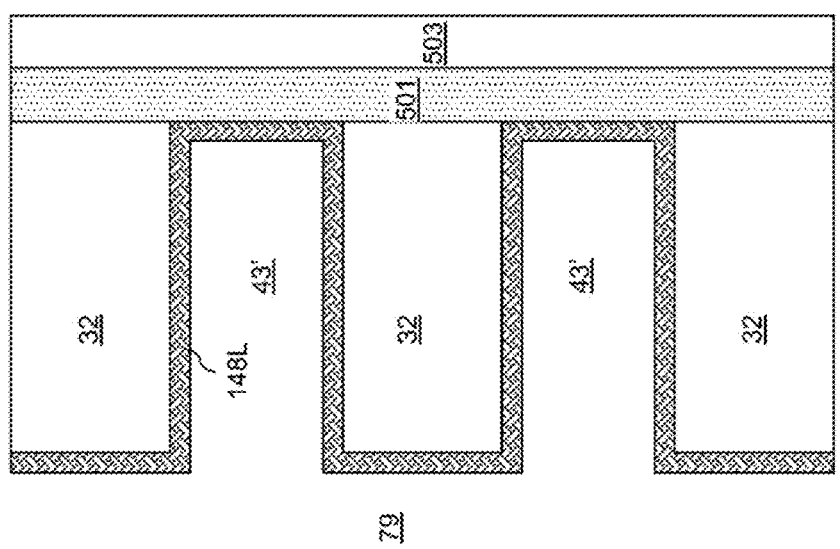

FIGS. 6A-6D illustrate processing steps that can be employed to form first exemplary electrically conductive layers according to a first embodiment of the present disclosure. Referring to FIG. 6A, a vertical cross-sectional magnified view of a magnified region M in FIGS. 5A and 5B is illustrated, which includes a portion of the backside contact trench 79 and a plurality of backside recesses 43. In one embodiment, a sidewall surface of at least one blocking dielectric (501, 503) can be physically exposed at end portions of backside recesses 43. The sidewall surface of the at least one blocking dielectric (501, 503) is an outer sidewall surface of a memory film 50 illustrated in FIG. 2F. Optionally, a backside blocking dielectric layer (not shown) including a blocking dielectric material can be formed on the physically exposed surfaces of the insulator layers 32 and the physically exposed sidewalls of the memory film 50 (See FIG. 2F).

An optional metallic barrier material layer 148L can be deposited in the backside recesses 43 and over the sidewall of the backside contact trench 79. The metallic barrier material layer 148L includes a metallic barrier material, which is a metallic material that blocks diffusion of metal elements therethrough. The metallic barrier material layer 148L can be a conductive metallic nitride layer such as TiN, TaN, WN, or a combination or an alloy thereof. The thickness of the metallic barrier material layer 148L can be in a range from 0.5 nm to 1.5 nm, although lesser and greater thicknesses can also be employed. The metallic barrier material layer 148L can be deposited, for example, by chemical vapor deposition (CVD) or atomic layer deposition (ALD). In general, the thickness of the metallic barrier material layer 148L can be thinner if cobalt is to be subsequently deposited on the sidewalls of the metallic barrier material layer 148L than if tungsten is to be subsequently deposited on the sidewalls of the metallic barrier material layer 148L. A backside cavity 43' is present in each unfilled volume of the backside recess 43, i.e., in each volume of the backside recess 43 that is not filled with the metallic barrier material layer 148L.

Referring to FIG. 6B, an anisotropic etch is performed to remove vertical portions of the metallic barrier material layer 148L from the sidewalls of each backside contact trench 79. The anisotropic etch can be a reactive ion etch that removes the material of the metallic barrier material layer 148L selective to the material of the insulator layers 32 and the material of the semiconductor material layer 10. Vertical portions of the metallic barrier material layer 148L are removed from the sidewall of the backside contact trench 79. Portions of the metallic barrier material layer 148L inside the backside recesses 43 are not removed by the anisotropic etch. Each remaining portion of the metallic barrier material layer 148L inside the backside recesses 43 constitutes a metallic barrier portion 148. Each metallic barrier material portion 148 can be a conformal material portion having a uniform thickness throughout. Sidewalls of the insulator layers 32 are physically exposed within each backside contact trench 79. The metallic barrier material portions 148 are formed as a plurality structures that are vertically disjoined from one another.

Figure 6D:
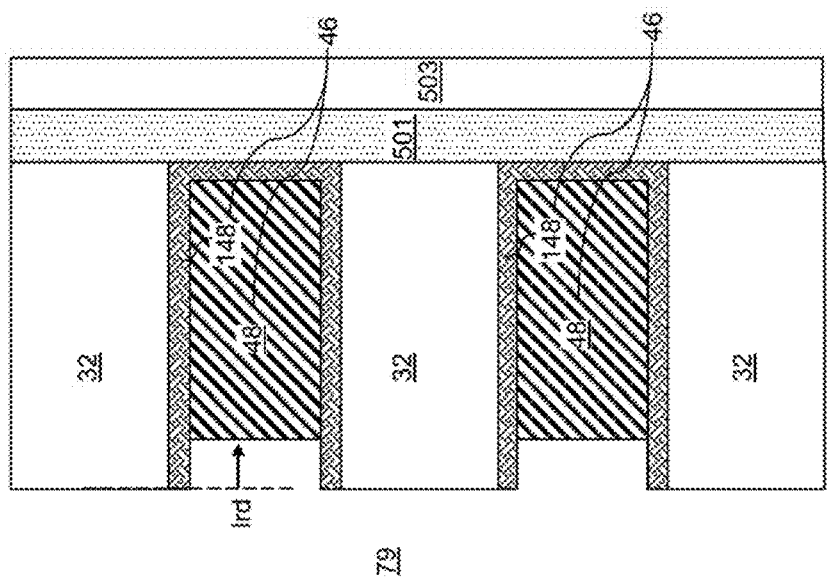
Figure 6C:
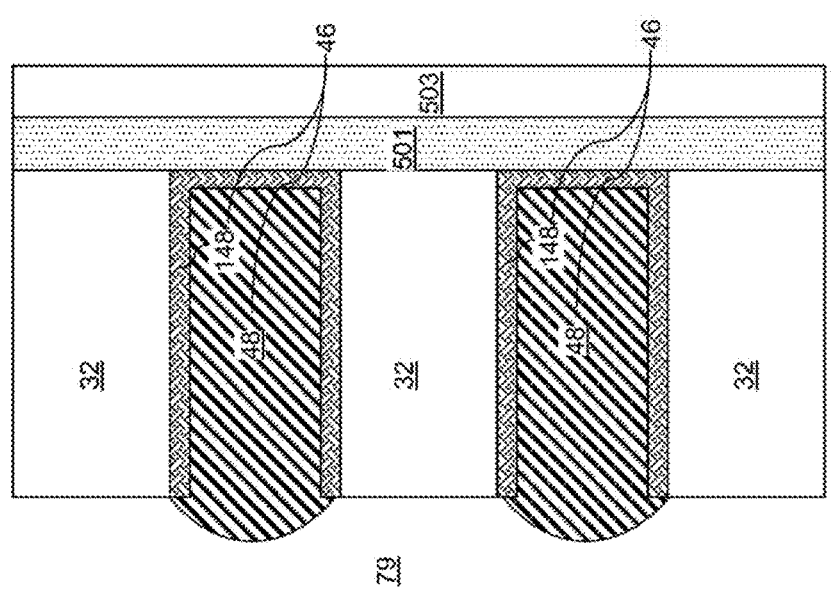

Referring to FIG. 6C, cobalt can be selectively deposited inside the backside cavities to form cobalt portions 48. Deposition of cobalt can be performed by chemical vapor deposition (CVD) or atomic layer deposition (ALD). Chemical vapor deposition or atomic layer deposition of cobalt employs a cobalt precursor that can be easily vaporized to leave high-purity cobalt on a surface without causing surface damage. In one embodiment, an organometallic compound with relatively high vapor pressures and good thermal stability can be employed as the cobalt precursor gas to deposit cobalt. In a non-limiting example, bis(cyclopentadienyl)cobalt, bis(ethylcyclopentadienyl)cobalt, bis(ethylcyclopentadienyl)cobalt, or bis(pentamethylcyclopentadienyl)cobalt can be employed as a cobalt precursor gas in a CVD or ALD process. Alternatively, different precursor gases (such as $Co_2(CO)_8$) can also be employed for cobalt deposition.

Cobalt may be selectively nucleated on a metallic surface such as the surfaces of the metallic barrier material portions 148. Thus, cobalt portions 48 can grow selectively only from the surfaces of the metallic barrier material portions 148, and do not grow from the sidewalls of the insulator layers 32. As such, the cobalt deposition process is a selective deposition process that proceeds from the surfaces of the metallic barrier material portions 148, while cobalt is not deposited on the surfaces of the insulator layers 32. Each cobalt portion 48 can be formed on surfaces of a respective metallic barrier material portion 148, and specifically, on a pair of horizontal surfaces of the respective metallic barrier material portion 148 and an outer sidewall of the respective metallic barrier material portion 148. Each deposited portion of cobalt constitutes one of the cobalt portions 48.

The duration of the cobalt deposition process can be selected such that the cobalt portions 48 completely fill the backside cavities 43'. In one embodiment, a convex sidewall of each cobalt portion 48 can protrude into the backside contact trench 79 due to the selective nature of the cobalt deposition process. A combination of a metallic barrier material portion 148 and a cobalt portion 48 embedded within the metallic barrier material portion 148 constitutes an electrically conductive layer 46 at each level. Thus, each electrically conductive layer 46 can consist of a cobalt portion 48 and a metallic barrier material portion 148. Each electrically conductive layer 46 can be formed directly on horizontal surfaces of the insulating layers 32 and directly on an outer sidewall of the memory film 50. In one embodiment, the electrically conductive layers 46 can be employed as is, and subsequent processing steps of FIG. 16 can be performed.

Alternatively, the cobalt portions 48 can be laterally recessed. FIG. 6D illustrates the optional step of laterally recessing the cobalt portions 48, in which cobalt can be isotropically etched employing an isotropic etch chemistry. The lateral recessing of the cobalt portions 48 can be performed by an isotropic dry etch or a wet etch. The lateral recess distance lrd, as measured between a vertical plane including a sidewall of the backside contact trench 79 and a sidewall of a cobalt portion 48 after the lateral recess, can be in a range from 3 nm to 5 nm, although lesser and greater thickness can be employed. A proximal sidewall of each cobalt portion 48 is laterally spaced from the memory film 50 (See FIG. 2F) by a vertical portion of a respective metallic barrier material portion 148. Each cobalt portion 48 can be laterally recessed from the backside contact trench 79. Specifically, a distal sidewall of each cobalt portion 48 (e.g., a left side sidewall in FIG. 6D) is more proximal to the memory film 50 than the sidewall of the backside contact trench 79 is to the memory film 50 by the lateral recess distance lrd. The lateral recessing of the sidewalls of the cobalt portions 48 is an optional process.

FIGS. 7A and 7B illustrate processing steps for forming second exemplary electrically conductive layers according to a second embodiment of the present disclosure. The structure of FIG. 7A can be derived from the structure of FIG. 6A by depositing a cobalt layer 48L on the metallic barrier material layer 148L. The cobalt layer 48L can be deposited employing the same deposition methods as the deposition methods employed to deposit the cobalt portions 48. Because the surfaces of the metallic barrier material layer 148L are present within the backside recesses 43 and in the backside contact trench 79, the cobalt layer 48L can be deposited as a contiguous layer filling the backside cavities 43' and extending through the entire height of the backside contact trench 79.

Referring to FIG. 7B, the cobalt layer 48L can be etched to physically expose sidewalls of the insulator layers 32. The etch of cobalt can be performed by an isotropic dry etch process or a wet etch process. The isotropic etch of cobalt may, or may not, be selective to the material of the metallic barrier material layer 148L. The cobalt layer 48L can be divided into disjoined discrete material portions located within each respective level. Each disjoined discrete material portion of the cobalt layer 48L is herein referred to as a cobalt portion 48. In one embodiment, an outer sidewall of each cobalt portion 48 can be laterally recessed from the sidewall of the backside contact trench 79 by a lateral recess distance lrd. A proximal sidewall of each cobalt portion 48 is laterally spaced from the memory film 50 (See FIG. 2F) by a vertical portion of a respective metallic barrier material portion 148. Each cobalt portion 48 can be laterally recessed from the backside contact trench 79. Specifically, a distal sidewall of each cobalt portion 48 is more proximal to the memory film 50 than the sidewall of the backside contact trench 79 is to the memory film 50 by the lateral recess distance lrd.

Subsequent to the etching of the cobalt layer 48L or concurrently with etching of the cobalt layer 48L, an anisotropic etch can be performed to remove vertical portions of the metallic barrier material layer 148L from the sidewalls of each backside contact trench 79. The anisotropic etch can be a reactive ion etch that removes the material of the metallic barrier material layer 148L selective to the material of the insulator layers 32 and the material of the semiconductor material layer 10. Portions of the metallic barrier material layer 148L inside the backside recesses 43 are not removed by the anisotropic etch. Each remaining portion of the metallic barrier material layer 148L inside the backside recesses 43 constitutes a metallic barrier portion 148.

Thus, portions of the contiguous cobalt layer 48L are etched back prior to removing the vertical portions of the metallic barrier material layer 148L. Each remaining portion of the contiguous cobalt layer 48L constitutes a cobalt portion 48 of the electrically conductive layers 46. The cobalt portions 48 may have distal sidewalls that are laterally recessed from the sidewalls of the backside trench 79, or may have distal sidewalls that are vertically coincident with the sidewalls of the backside trench 79. Each metallic barrier material portion 148 can be a conformal material portion having a uniform thickness throughout. Sidewalls of the insulator layers 32 are physically exposed within each backside contact trench 79. Each cobalt portion 48 can be formed on surfaces of a respective metallic barrier material portion 148, and specifically, on a pair of horizontal surfaces of the respective metallic barrier material portion 148 and an outer sidewall of the respective metallic barrier material portion 148. A combination of a metallic barrier material portion 148 and a cobalt portion 48 embedded within the metallic barrier material portion 148 constitutes an electrically conductive layer 46 at each level. Each electrically conductive layer 46 can consist of a cobalt portion 48 and a metallic barrier material portion 148.

Figure 8C:
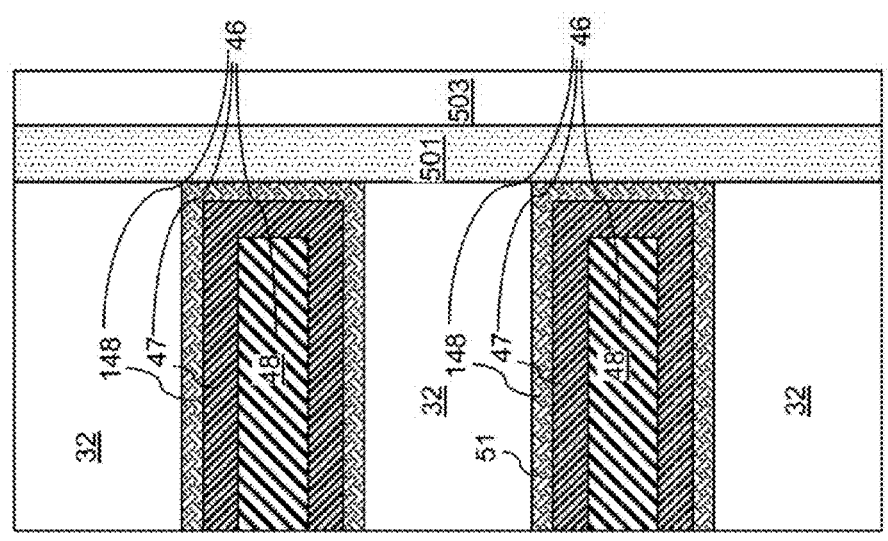

FIGS. 8A-8C illustrate processing steps for forming third exemplary electrically conductive layers according to a third embodiment of the present disclosure. The structure of FIG. 8A can be derived from the structure of FIG. 6A by depositing a metallic material layer 47L on the metallic barrier material layer 148L. The metallic material layer 47L can be a contiguous layer extending through the entire vertical height of the backside contact trench 79. The metallic material layer 47L can include any metallic material other than cobalt. In one embodiment, the metallic material layer 47L can consist essentially of a single elemental metal or an intermetallic alloy of at least two elemental metals. For example, the metallic material layer 47L can comprise molybdenum, tungsten, copper, ruthenium, or titanium, or a combination thereof. In one embodiment, the metallic material layer 47L can comprise tungsten or a tungsten-containing intermetallic alloy. The thickness of the metallic material layer 47L can be selected such that the backside cavities 43' are not completely filled with the metallic material layer 47L.

Referring to FIG. 8B, an anisotropic etch is performed to remove vertical portions of the metallic barrier material layer 148L and the metallic material layer 47L from the sidewalls of each backside contact trench 79. The anisotropic etch can be a reactive ion etch that removes the materials of the metallic barrier material layer 148L and the metallic material layer 47L selective to the material of the insulator layers 32 and the material of the semiconductor material layer 10. Portions of the metallic barrier material layer 148L and the metallic material layer 47L inside the backside recesses 43 are not removed by the anisotropic etch. Each remaining portion of the metallic barrier material layer 148L inside the backside recesses 43 constitutes a metallic barrier portion 148. Each remaining portion of the metallic material layer 47L inside the backside recesses 43 constitutes a metallic material portion 47. Each metallic barrier material portion 148 can be a conformal material portion having a uniform thickness throughout. Likewise, each metallic material portion 47 can be a conformal material portion having another uniform thickness throughout. Sidewalls of the insulator layers 32 are physically exposed within each backside contact trench 79. The metallic barrier material portions 148 are formed as a plurality structures that are vertically disjoined from one another. Further, the metallic material portions 47 are formed as a plurality structures that are vertically disjoined from one another. Alternately, the processing steps of FIGS. 6A and 6B can be performed, and the metallic material portions 47 can be deposited by a selective deposition process.

Referring to FIG. 8C, cobalt can be deposited inside the backside cavities 43' to form cobalt portions 48. Deposition of cobalt can be performed employing the same methods as in the first embodiment. Cobalt portions 48 grow only from the surfaces of the metallic material portions 47 and the metallic barrier material portions 148, and do not grow from the sidewalls of the insulator layers 32. As such, the cobalt deposition process is a selective deposition process that proceeds from the surfaces of the metallic material portions 47, while cobalt is not deposited on the surfaces of the insulator layers 32. Each cobalt portion 48 can be formed on surfaces of a respective metallic material portion 47, and specifically, on a pair of horizontal surfaces of the respective metallic material portion 47 and an outer sidewall of the respective metallic material portion 47. Each deposited portion of cobalt constitutes one of the cobalt portions 48.

The duration of the cobalt deposition process can be selected such that the cobalt portions 48 completely fill the backside cavities 43'. A combination of a metallic barrier material portion 148, a metallic material portion 47 embedded within the metallic barrier material portion 148, and a cobalt portion 48 embedded within the metallic material portion 47 constitutes an electrically conductive layer 46 at each level. Thus, each electrically conductive layer 46 can comprise a cobalt portion 48, a metallic material portion 47 including a metallic material other than cobalt, and a metallic barrier material portion 148. Each electrically conductive layer 46 can be formed directly on horizontal surfaces of the insulating layers 32 and directly on an outer sidewall of the memory film 50. Optionally, the cobalt portions 48 and/or the metallic material portions 47 can be laterally recessed from the sidewall of the backside contact trench 79. In this case, each of the electrically conductive layers 46 comprises a metallic barrier material portion 148 contacting an outer sidewall of the memory film 50, a metallic material portion 47 containing a material other than cobalt and contacting the metallic barrier material portion 148, and a respective cobalt portion 48 contacting horizontal surfaces of the metallic material portion 47 and not contacting the metallic barrier material portion 148.

Figure 9B:
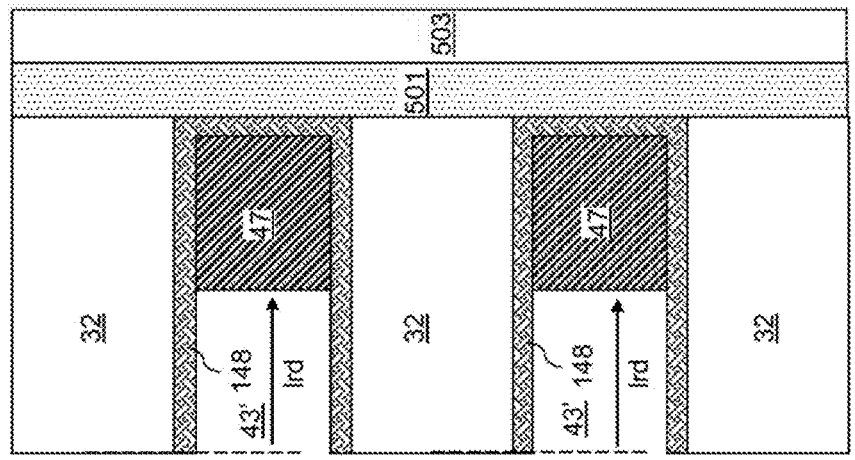
FIGS. 9A-9C are sequential vertical cross-sectional views of a magnified region M in FIGS. 5A and 5B during formation of fourth exemplary electrically conductive layers according to a fourth embodiment of the present disclosure.
Figure 9A:
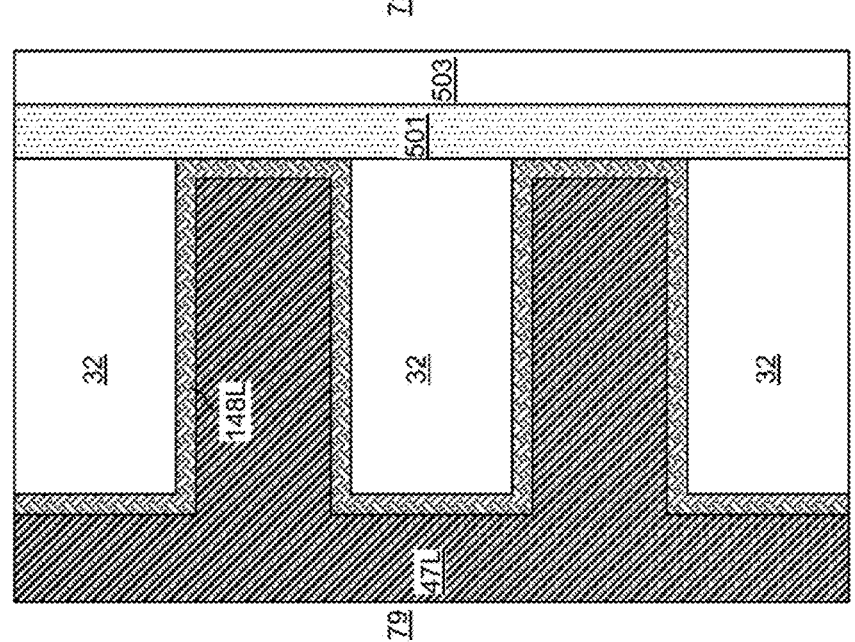
Figure 9C:
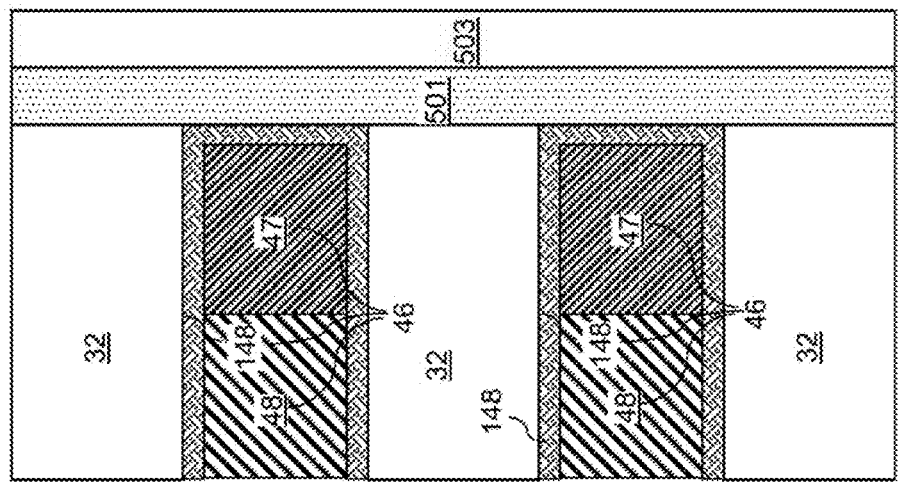

FIGS. 9A-9C illustrate processing steps for forming fourth exemplary electrically conductive layers according to a fourth embodiment of the present disclosure. The structure of FIG. 9A can be derived from the structure of FIG. 6A by depositing a metallic material layer 47L on the metallic barrier material layer 148L. The metallic material layer 47L can include any metallic material other than cobalt. In one embodiment, the metallic material layer 47L can consist essentially of a single elemental metal or an intermetallic alloy of at least two elemental metals. For example, the metallic material layer 47L can comprise molybdenum, tungsten, copper, titanium, ruthenium, or a combination thereof. In one embodiment, the metallic material layer 47L can comprise tungsten or a tungsten-containing intermetallic alloy. The thickness of the metallic material layer 47L can be selected such that the backside cavities 43' are completely filled with the metallic material layer 47L.

Referring to FIG. 9B, vertical portions of the metallic material layer 47L and the metallic barrier material layer 148L are removed from the sidewall of the backside contact trench 79. The metallic material layer 47L can be isotropically etched to physically expose the sidewall of the metallic barrier material layer 148L located adjacent to the sidewall of each backside contact trench 79. The isotropic etch of tungsten can be performed by an isotropic dry etch process or a wet etch process. The isotropic etch of the metallic material layer 47L can be selective to the material of the metallic barrier material layer 148L. The duration of the isotropic etch can be selected such that remaining portions of the metallic material layer 47L are laterally recessed from the sidewall of the backside contact trench 79 by a lateral recess distance lrd. The metallic material layer 47L is divided into disjoined discrete material portions located within each respective level. Each disjoined discrete material portion of the metallic material layer 47L constitutes a metallic material portion 47.

Subsequently, an anisotropic etch is performed to remove vertical portions of the metallic barrier material layer 148L from the sidewalls of each backside contact trench 79. The anisotropic etch can be a reactive ion etch that removes the material of the metallic barrier material layer 148L selective to the material of the insulator layers 32 and the material of the semiconductor material layer 10. Portions of the metallic barrier material layer 148L inside the backside recesses 43 are not removed by the anisotropic etch. Each remaining portion of the metallic barrier material layer 148L inside the backside recesses 43 constitutes a metallic barrier portion 148. Thus, portions of the metallic material layer 47L are etched back prior to removing the vertical portions of the metallic barrier material layer 148L. Each remaining portion of the metallic material layer 47L constitutes a metallic material portion 47 of electrically conductive layers to be formed. Alternately, an anisotropic etch may be employed to remove the vertical portions of the metallic material layer 47L and the metallic barrier material layer 148L, and an isotropic etch may be employed to laterally recess the metallic material portions 47.

In one embodiment, the lateral recess distance lrd can be greater than the height of a backside recess 43, which is the same as the height of a metallic barrier material portion 148 within the backside recess 43. In one embodiment, the lateral recess distance lrd can be in a range from 15% to 85% of the lateral distance between the sidewall of the backside contact trench 79 and the outer sidewall of the memory film 50, e.g., the outer sidewall of the at least one blocking dielectric layer (501L, 503L). In one embodiment, the lateral recess distance lrd can be determined to optimize the resistance of the electrically conductive layers to be formed in the backside recesses and the overall stress that the electrically conductive layers will generate. A distal sidewall of each metallic material portion 47 is more proximal to the memory film 50 than the sidewall of the backside contact trench 79 is to the memory film 50 by the lateral recess distance lrd. A proximal sidewall of each metallic material portion 47 can contact an outer sidewall of a metallic barrier material portion 148.

Referring to FIG. 9C, cobalt can be deposited inside the backside cavities 43' to form cobalt portions 48. Deposition of cobalt can be performed employing the same methods as in the first embodiment. Cobalt portions 48 grow only from the surfaces of the metallic material portions 47 and the metallic barrier material portions 148, and do not grow from the sidewalls of the insulator layers 32. As such, the cobalt deposition process is a selective deposition process that proceeds from the surfaces of the metallic barrier material portions 148 and the surfaces of the metallic material portions 47, while cobalt is not deposited on the surfaces of the insulator layers 32. Thus, each cobalt portion 48 can be formed on a respective metallic material portion 47 and a respective metallic barrier material portion 148, and specifically, on a pair of horizontal surfaces of the respective metallic barrier material portion 148 and an outer sidewall of the respective metallic material portion 47. Each deposited portion of cobalt constitutes one of the cobalt portions 48.

In one embodiment, the duration of the cobalt deposition process can be selected such that the cobalt portions 48 completely fill the backside cavities 43'. A combination of a metallic barrier material portion 148, a cobalt portion 48 contacting horizontal surfaces of the metallic barrier material portion 148, and a metallic material portion 47 encapsulated by the metallic barrier material portion 148 and the cobalt portion 48 constitutes an electrically conductive layer 46 at each level. Thus, each electrically conductive layer 46 can comprise a cobalt portion 48, a metallic material portion 47 including a metallic material other than cobalt, and a metallic barrier material portion 148. Each electrically conductive layer 46 can be formed directly on horizontal surfaces of the insulating layers 32 and directly on an outer sidewall of the memory film 50. Optionally, an anisotropic etch or an isotropic etch can be performed to remove regions of the cobalt portions 48 inside backside contact trench 79. In this case, the cobalt portions 48 can have sidewalls that are vertically coincident with sidewalls of the insulator layers 32 around the backside contact trench 79. Optionally, the cobalt portions 48 may be laterally recessed from the sidewall of the backside contact trench 79, for example, by a recess etch. In one embodiment, each cobalt portion 48 is laterally spaced from a vertical portion of a metallic barrier material portion 148 located at a same level by a respective metallic material portion 47 that comprises tungsten or a tungsten alloy.

Figure 10B:
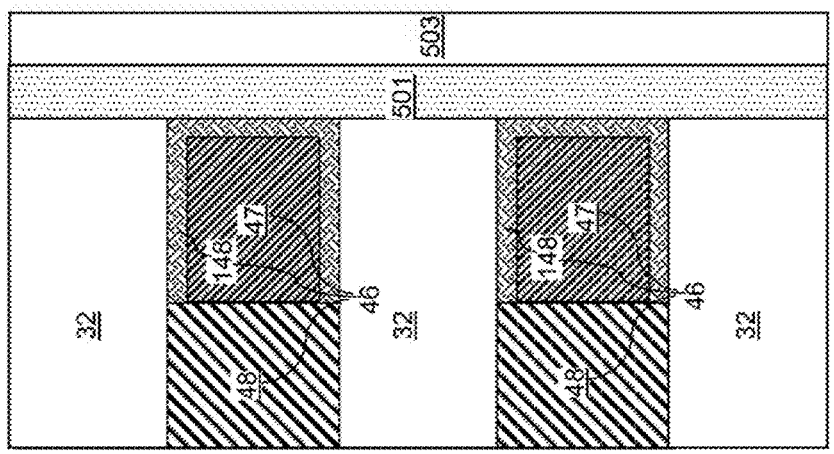
FIGS. 10A and 10B are sequential vertical cross-sectional views of a magnified region M in FIGS. 5A and 5B during formation of fifth exemplary electrically conductive layers according to a fifth embodiment of the present disclosure.
Figure 10A:
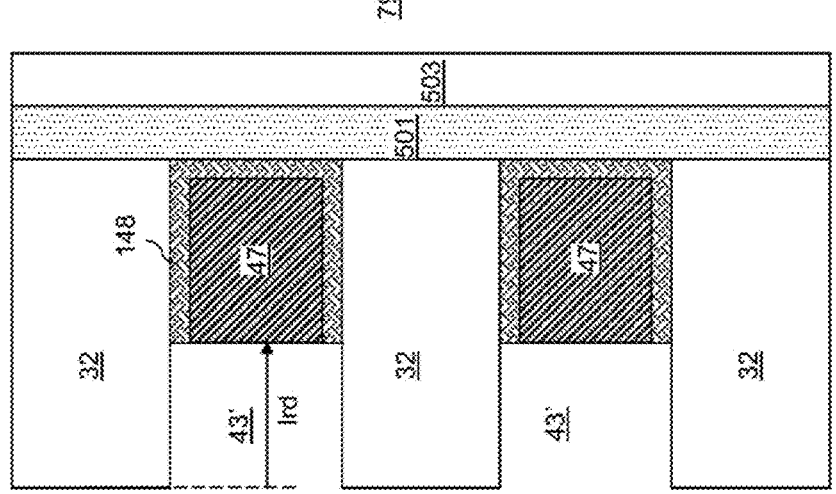

FIGS. 10A and 10B illustrate processing steps for forming fifth exemplary electrically conductive layers according to a fifth embodiment of the present disclosure. The structure of FIG. 10A can be derived from the structure of FIG. 9B by etching physically exposed portions of the metallic barrier material portions 148.

Alternatively, the structure of FIG. 10A can be derived from the structure of FIG. 9A by simultaneously etching, or by sequentially etching, the metallic material layer 47L and the metallic barrier material layer 148L. At least one isotropic etch process can be employed to laterally recess the metallic material layer 47L and the metallic barrier material layer 148L, and to form backside recesses 43'. After the isotropic etching of the metallic material layer 47L, the metallic material layer 47L can be divided into disjoined discrete material portions located within each respective level. Each disjoined discrete material portion of the metallic material layer 47L is herein referred to as a metallic material portion 47.

Subsequently, an isotropic etch process is employed to etch the physically exposed portions of the metallic barrier material layer 148L. In other words, an isotropic etch is employed to remove physically exposed portions of the metallic barrier material layer 148L at the processing step of FIG. 10A in lieu of an anisotropic etch that is employed to remove the portions of the metallic barrier material layer 148L within the backside contact trench 79 at the processing steps of FIG. 9B. The isotropic etch process that etches the physically exposed portions of the metallic barrier material layer 148L can be an isotropic dry etch or a wet etch.

The isotropic etch divides the metallic barrier material layer 148L into disjoined discrete material portions located within each respective level. Each disjoined discrete material portion of the metallic barrier material layer 148L is herein referred to as a metallic barrier material portion 148. Thus, portions of the metallic material layer 47L are etched back prior to removing the physically exposed portions of the metallic barrier material layer 148L. A distal sidewall of each metallic material portion 47 and a distal sidewall of each metallic barrier material portion 148 can be more proximal to the memory film 50 than the sidewall of the backside contact trench 79 is to the memory film 50 by the lateral recess distance lrd. A proximal sidewall of each metallic material portion 47 can contact an outer sidewall of a metallic barrier material portion 148.

Referring to FIG. 10B, cobalt can be deposited inside the backside cavities 43' to form cobalt portions 48. Deposition of cobalt can be performed employing the same methods as in the first embodiment. Cobalt portions 48 grow only from the surfaces of the metallic material portions 47 and the metallic barrier material portions 148, and do not grow from the sidewalls of the insulator layers 32. As such, the cobalt deposition process is a selective deposition process that proceeds from the surfaces of the metallic barrier material portions 148 and the surfaces of the metallic material portions 47, while cobalt is not deposited on the surfaces of the insulator layers 32. Thus, each cobalt portion 48 can be formed on a respective metallic material portion 47 and a respective metallic barrier material portion 148, and specifically, on vertical sidewalls of the respective metallic material portion 47 and the respective metallic barrier material portion 148. Each deposited portion of cobalt constitutes one of the cobalt portions 48.

In one embodiment, the duration of the cobalt deposition process can be selected such that the cobalt portions 48 completely fill the backside cavities 43'. A combination of a metallic barrier material portion 148, a cobalt portion 48 contacting horizontal surfaces of a pair of insulator layers 32, and a metallic material portion 47 encapsulated by the metallic barrier material portion 148 and the cobalt portion 48 constitutes an electrically conductive layer 46 at each level. Thus, each electrically conductive layer 46 can comprise a cobalt portion 48, a metallic material portion 47 including a metallic material other than cobalt, and a metallic barrier material portion 148. Each electrically conductive layer 46 can be formed directly on horizontal surfaces of the insulating layers 32 and directly on an outer sidewall of the memory film 50. Optionally, an anisotropic etch or an isotropic etch can be performed to remove regions of the cobalt portions 48 inside backside contact trench 79. In this case, the cobalt portions 48 can have sidewalls that are vertically coincident with sidewalls of the insulator layers 32 around the backside contact trench 79. Optionally, the cobalt portions 48 may be laterally recessed from the sidewall of the backside contact trench 79, for example, by a recess etch. Each cobalt portion 48 contacts a horizontal surface of an overlying dielectric layer (e.g., an overlying insulator layer 32) and a horizontal surface of an underlying dielectric layer (e.g., an underlying insulator layer 32).

FIGS. 11A and 11B illustrate processing steps for forming sixth exemplary electrically conductive layers according to a sixth embodiment of the present disclosure. The structure of FIG. 11A can be derived from the structure of FIG. 6A by depositing a cobalt layer 48L on the metallic barrier material layer 148L. The cobalt layer 48L can be deposited employing the same deposition methods as the deposition methods employed to deposit the cobalt portions 48 of FIG. 6C or the cobalt layer 48L of FIG. 7A. The thickness of the cobalt layer 48L can be selected such that the backside cavities 43' are not completely filled with the cobalt layer 48L. For example, the duration of the cobalt deposition process in a chemical vapor deposition process or the number of cycles in an atomic layer deposition process can be selected such that the backside recesses 43 are not completely filled at the end of the deposition process. Thus, a backside cavity 43' is present within each backside recess 43 after formation of the cobalt layer 48L.

Referring to FIG. 11B, an anisotropic etch is performed to remove vertical portions of the metallic barrier material layer 148L and the cobalt layer 48L from the sidewalls of each backside contact trench 79. The anisotropic etch can be a reactive ion etch that removes the materials of the metallic barrier material layer 148L and the cobalt layer 48L selective to the material of the insulator layers 32 and the material of the semiconductor material layer 10. Portions of the metallic barrier material layer 148L and the cobalt layer 48L inside the backside recesses 43 are not removed by the anisotropic etch. Each remaining portion of the metallic barrier material layer 148L inside the backside recesses 43 constitutes a metallic barrier portion 148. Each remaining portion of the cobalt layer 48L inside the backside recesses 43 constitutes a cobalt portion 48. Each metallic barrier material portion 148 can be a conformal material portion having a uniform thickness throughout. Likewise, each cobalt portion 48 can be a conformal material portion having another uniform thickness throughout. Sidewalls of the insulator layers 32 are physically exposed within each backside contact trench 79. The metallic barrier material portions 148 are formed as a plurality structures that are vertically disjoined from one another. Further, the cobalt portions 48 are formed as a plurality structures that are vertically disjoined from one another. Each cobalt portion 48 of the electrically conductive layers 46 is formed on surfaces of a respective metallic barrier material portion 148.

Referring to FIG. 11C, a metallic material can be deposited inside the backside cavities 43' to form metallic material portions 47. The metallic material portions 47 can include any metallic material other than cobalt. In one embodiment, the metallic material portions 47 can consist essentially of a single elemental metal or an intermetallic alloy of at least two elemental metals. For example, the metallic material portions 47 can comprise molybdenum, tungsten, copper, titanium, ruthenium, or a combination thereof. In one embodiment, the metallic material portions 47 can comprise tungsten or a tungsten-containing intermetallic alloy.

Deposition of the metallic material can be performed employing the same methods as in the third embodiment. In one embodiment, the metallic material portions 47 grow from the surfaces of the cobalt portions 48, and do not grow from the sidewalls of the insulator layers 32. As such, the metallic material deposition process is a selective deposition process that proceeds from the surfaces of the cobalt portions 48, while the metallic material is not deposited on the surfaces of the insulator layers 32. Thus, each metallic material portion 47 can be formed on surfaces of a respective cobalt portion 48, and specifically, on a pair of horizontal surfaces of the respective cobalt portion 48 and an outer sidewall of the respective cobalt portion 48. Each deposited portion of metallic material constitutes one of the metallic material portions 47.

The duration of the metallic material deposition process can be selected such that the metallic material portions 47 completely fill the backside cavities 43'. A metallic material portion 47 is formed on a respective cobalt portion 48 in each backside cavity 43', i.e., in the vacant portion of each backside recess. A combination of a metallic barrier material portion 148, a cobalt portion 48 embedded within the metallic barrier material portion 148, and a metallic material portion 47 embedded within the cobalt portion 48 constitutes an electrically conductive layer 46 at each level. Thus, each electrically conductive layer 46 can comprise a cobalt portion 48, a metallic material portion 47 including a metallic material other than cobalt, and a metallic barrier material portion 148. Each electrically conductive layer 46 can be formed directly on horizontal surfaces of the insulating layers 32 and directly on an outer sidewall of the memory film 50. Each metallic material portion 47 is vertically and laterally spaced from a metallic barrier material portion 148 located at a same level by a respective cobalt portion 48. Optionally, the cobalt portions 48 and/or the metallic material portions 47 can be laterally recessed from the sidewall of the backside contact trench 79.

Figure 12B:
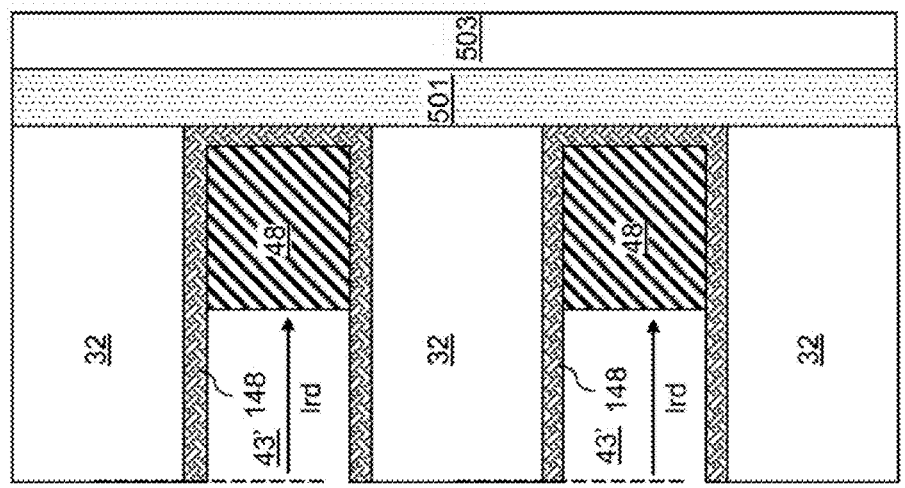
Figure 12A:
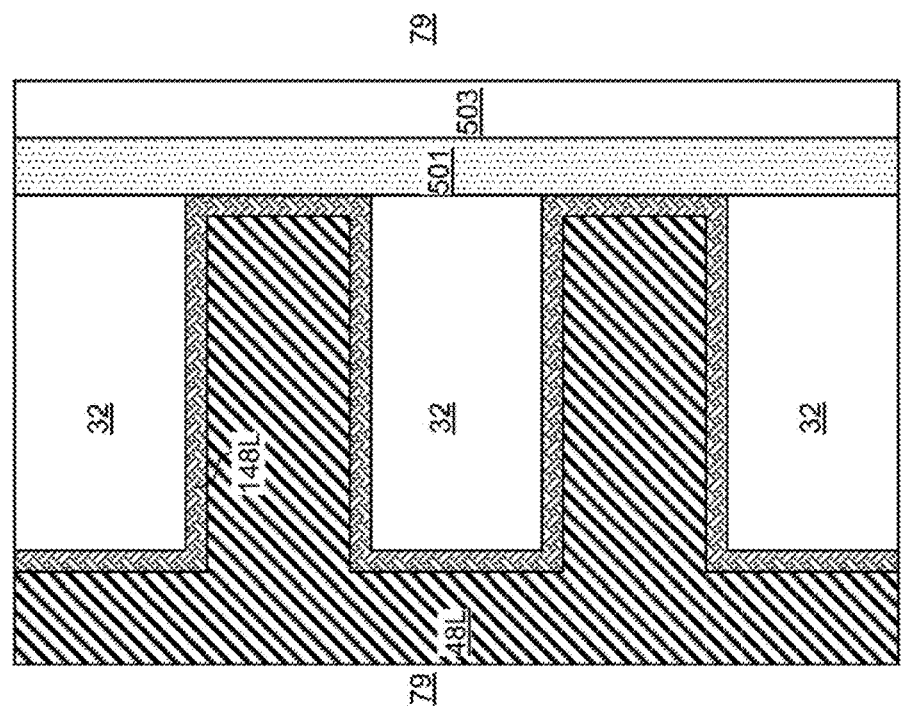

FIGS. 12A-12C illustrate processing steps for forming seventh exemplary electrically conductive layers according to a seventh embodiment of the present disclosure. The structure of FIG. 12A can be the same as the structure of FIG. 7A according to the second embodiment, and can be formed employing the same method as the second embodiment. In one embodiment, the cobalt layer 48L can consist essentially of cobalt.

Referring to FIG. 12B, the cobalt layer 48L can be isotropically etched to physically expose the sidewall of the metallic barrier material layer 148L located adjacent to the sidewall of each backside contact trench 79. The isotropic etch of cobalt can be performed by an isotropic dry etch process or a wet etch process. The isotropic etch of the cobalt layer 48L can be selective to the material of the metallic barrier material layer 148L. The duration of the isotropic etch can be selected such that remaining portions of the cobalt layer 48L are laterally recessed from the sidewall of the backside contact trench 79 by a lateral recess distance lrd. The cobalt layer 48L is divided into disjoined discrete material portions located within each respective level. Each disjoined discrete material portion of the cobalt layer 48L is herein referred to as a cobalt portion 48. Each cobalt portion 48 of the electrically conductive layers 46 is formed on surfaces of a respective metallic barrier material portion 148. Alternatively, a combination of an anisotropic etch and an isotropic etch can be employed to form the structure of FIG. 12B.

In one embodiment, the lateral recess distance lrd can be greater than the height of a backside recess 43, which is the same as the height of a metallic barrier material portion 148 within the backside recess 43. In one embodiment, the lateral recess distance lrd can be in a range from 15% to 85% of the lateral distance between the sidewall of the backside contact trench 79 and the outer sidewall of the memory film 50, e.g., the outer sidewall of the at least one blocking dielectric layer (501L, 503L). In one embodiment, the lateral recess distance lrd can be determined to optimize the resistance of the electrically conductive layers to be formed in the backside recesses and the overall stress that the electrically conductive layers will generate. A distal sidewall of each cobalt portion 48 is more proximal to the memory film 50 than the sidewall of the backside contact trench 79 is to the memory film 50 by the lateral recess distance lrd. A proximal sidewall of each cobalt portion 48 can contact an outer sidewall of a metallic barrier material portion 148. A proximal sidewall of each cobalt portion 48 is laterally spaced from the memory film 50 by a vertical portion of a respective metallic barrier material portion 148, and each cobalt portion 48 is laterally recessed from the backside contact trench 79.

Subsequently, an anisotropic etch is performed to remove vertical portions of the metallic barrier material layer 148L from the sidewalls of each backside contact trench 79. The anisotropic etch can be a reactive ion etch that removes the material of the metallic barrier material layer 148L selective to the material of the insulator layers 32 and the material of the semiconductor material layer 10. Portions of the metallic barrier material layer 148L inside the backside recesses 43 are not removed by the anisotropic etch. Each remaining portion of the metallic barrier material layer 148L inside the backside recesses 43 constitutes a metallic barrier portion 148. Thus, portions of the cobalt layer 48L are etched back prior to removing the vertical portions of the metallic barrier material layer 148L. Each remaining portion of the cobalt layer 48L constitutes a cobalt portion 48 of electrically conductive layers to be formed.

Referring to FIG. 12C, a metallic material can be deposited inside the backside cavities 43' to form metallic material portions 47. The metallic material portions 47 can include any metallic material other than cobalt. In one embodiment, the metallic material portions 47 can consist essentially of a single elemental metal or an intermetallic alloy of at least two elemental metals. For example, the metallic material portions 47 can comprise molybdenum, tungsten, copper, titanium, ruthenium, or a combination thereof. In one embodiment, the metallic material portions 47 can comprise tungsten or a tungsten-containing intermetallic alloy. Deposition of metallic material can be performed employing the same methods as in the third embodiment. The metallic material portions 47 grow only from the surfaces of the cobalt portions 48 and the metallic barrier material portions 148, and do not grow from the sidewalls of the insulator layers 32. As such, the metallic material deposition process is a selective deposition process that proceeds from the surfaces of the metallic barrier material portions 148 and the surfaces of the cobalt portions 48, while the metallic material is not deposited on the surfaces of the insulator layers 32. Thus, each metallic material portion 47 can be formed on a respective cobalt portion 48 and a respective metallic barrier material portion 148, and specifically, on a pair of horizontal surfaces of the respective metallic barrier material portion 148 and an outer sidewall of the respective cobalt portion 48. Each deposited portion of metallic material constitutes one of the metallic material portions 47.

In one embodiment, the duration of the metallic material deposition process can be selected such that the metallic material portions 47 completely fill the backside cavities 43'. A metallic material portion 47 is formed on a respective cobalt portion 48 in each backside cavity 43', i.e., in the vacant portion of each backside recess. A combination of a metallic barrier material portion 148, a metallic material portion 47 contacting horizontal surfaces of the metallic barrier material portion 148, and a cobalt portion 48 encapsulated by the metallic barrier material portion 148 and the metallic material portion 47 constitutes an electrically conductive layer 46 at each level. Thus, each electrically conductive layer 46 can comprise a metallic material portion 47, a cobalt portion 48 including cobalt, and a metallic barrier material portion 148 including a metallic material other than cobalt. Each electrically conductive layer 46 can be formed directly on horizontal surfaces of the insulating layers 32 and directly on an outer sidewall of the memory film 50. Each metallic material portion 47 contacts a pair of horizontal surfaces of a metallic barrier material portion 148 located at the same level and a distal sidewall of the cobalt portion 48 located at the same level. Optionally, an anisotropic etch can be performed to remove regions of the metallic material portions 47 inside backside contact trench 79. In this case, the metallic material portions 47 can have sidewalls that are vertically coincident with sidewalls of the insulator layers 32 around the backside contact trench 79. Optionally, the metallic material portions 47 may be laterally recessed from the sidewall of the backside contact trench 79, for example, by a recess etch.

Figure 13B:
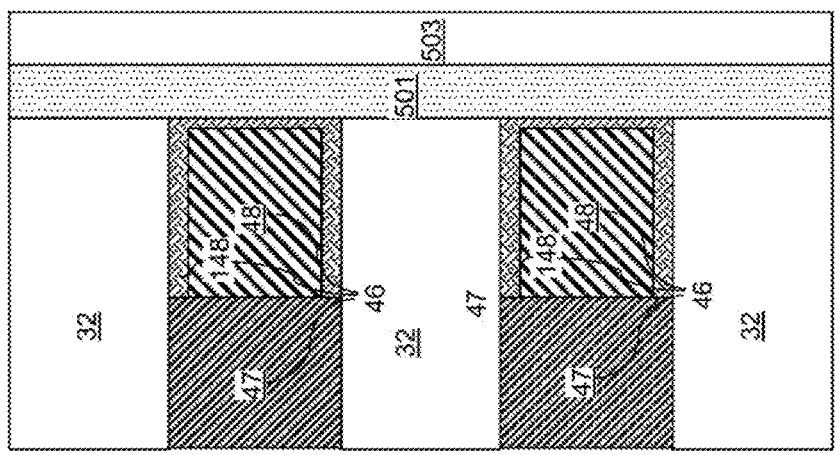
FIGS. 13A and 13B are sequential vertical cross-sectional views of a magnified region M in FIGS. 5A and 5B during formation of eighth exemplary electrically conductive layers according to an eighth embodiment of the present disclosure.
Figure 13A:
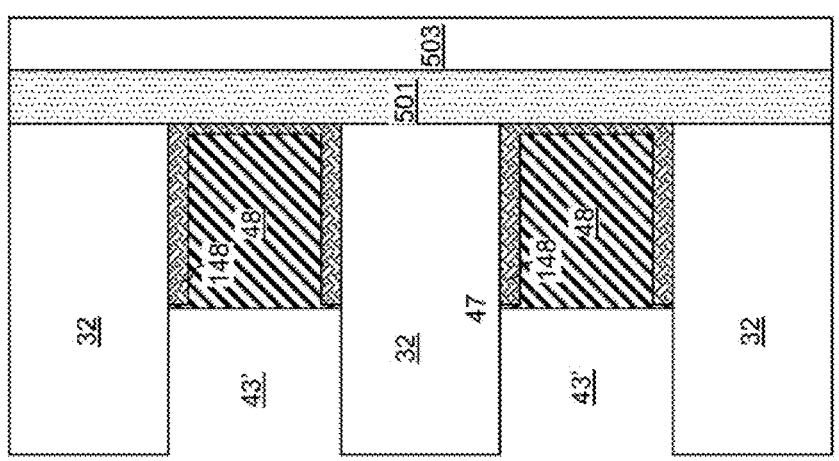

FIGS. 13A-13B illustrate processing steps for forming eighth exemplary electrically conductive layers according to an eighth embodiment of the present disclosure. The structure of FIG. 13A can be derived from the exemplary structure of FIG. 12B by isotropically etching physically exposed portions of each metallic barrier material portion 148. Alternately, the metallic barrier material portions 148 can be laterally recessed at about the same etch rate as the cobalt portion 48 from the exemplary structure of FIG. 12A.

Referring to FIG. 13B, the processing steps of FIG. 12C can be performed to form the metallic material portions 47, which can be, for example, tungsten portions. The metallic material portions 47 grow from the respective vertical metallic surfaces of the metallic barrier material portion 148 and the cobalt portion 48 at each level. Each metallic material portion 47 can contact a horizontal surface of an underlying dielectric layer (which can be, for example, an underlying insulator layer 32) and a horizontal surface of an overlying dielectric layer (which can be, for example, an overlying insulator layer 32).

FIGS. 14A-14E illustrate processing steps for forming ninth exemplary electrically conductive layers according to a ninth embodiment of the present disclosure. The structure of FIG. 14A can be derived from the structure of FIGS. 5A and 5B by forming a backside blocking dielectric layer 51 prior to formation of a metallic barrier material layer 148L. The backside blocking dielectric layer 51 includes a dielectric material, which can comprise a high dielectric constant (high-k) dielectric material having a dielectric constant greater than 7.9 (such as aluminum oxide), and/or silicon oxide and/or silicon nitride. The backside blocking dielectric layer 51 can be formed, for example, by chemical vapor deposition (CVD) or atomic layer deposition (ALD). The thickness of the backside blocking dielectric layer 51 can be in a range from 0.5 nm to 1.5 nm, although lesser and greater thicknesses can also be employed. The metallic barrier material layer 148L can be formed in the same manner as in the first embodiment.

Referring to FIG. 14B, a disposable material layer 143L is formed in the backside cavities 43'. The disposable material layer 143L can fill the entirety of the backside cavities 43'. As used herein, a "disposable" material refers to a temporary material that is subsequently removed. The disposable material layer 143L includes a material that can be removed selective to the material of the metallic barrier material layer 148L. In one embodiment, the disposable material layer 143L can comprise a semiconductor material such as polysilicon, amorphous silicon, a silicon-germanium alloy, or a combination thereof. The disposable material layer 143L can be deposited, for example, by chemical vapor deposition.

Figure 14C:
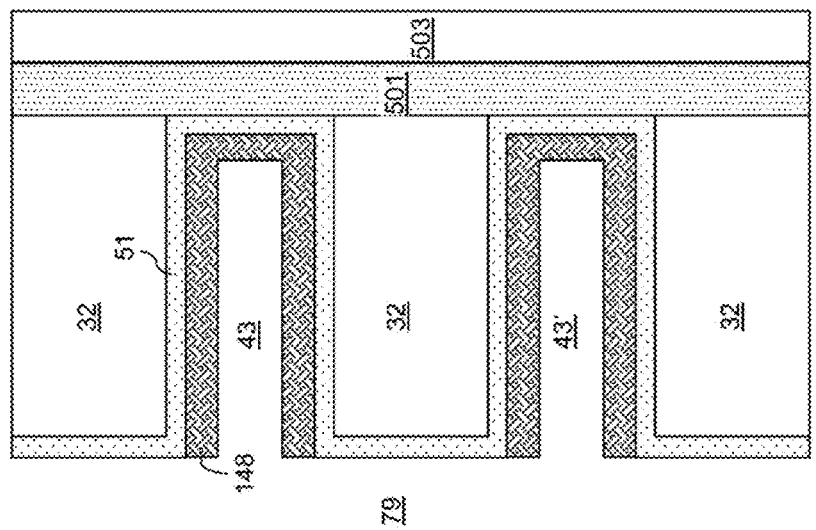

Referring to FIG. 14C, the material of the disposable material layer 143L and the metallic barrier material layer 148L are isotropically or anisotropically etched to physically expose sidewalls of the backside blocking dielectric layer 51. The etch of the disposable material layer 143L can be performed by a dry etch or a wet etch. For example, if the disposable material layer 143L comprises silicon, the disposable material layer 143L can be etched by an etch process employing one or more of $BCl_3$; a combination of $SiCl_4$, $Cl_2$, and HCl; a combination of $O_2$, $SiCl_4$, and HCl; $SF_6$; and $NF_3$. Each remaining portion of the disposable material layer 143L within a backside recess is herein referred to as a disposable material portion 143.

Subsequent to, or concurrently with, the etch of the vertical portion of the disposable material layer 143L, physically exposed portions of the metallic barrier material layer 148L is removed by an etch selective to the backside blocking dielectric layer 51. Each remaining portion of the metallic barrier material layer 148L constitutes a metallic barrier material portion 148. In other words, a metallic barrier material portion 148 and a disposable material portion 143 can be formed at each level of the of backside recesses by removing vertical portions of the disposable material layer 143L and the metallic barrier material layer 148L, respectively.

Figure 14D:
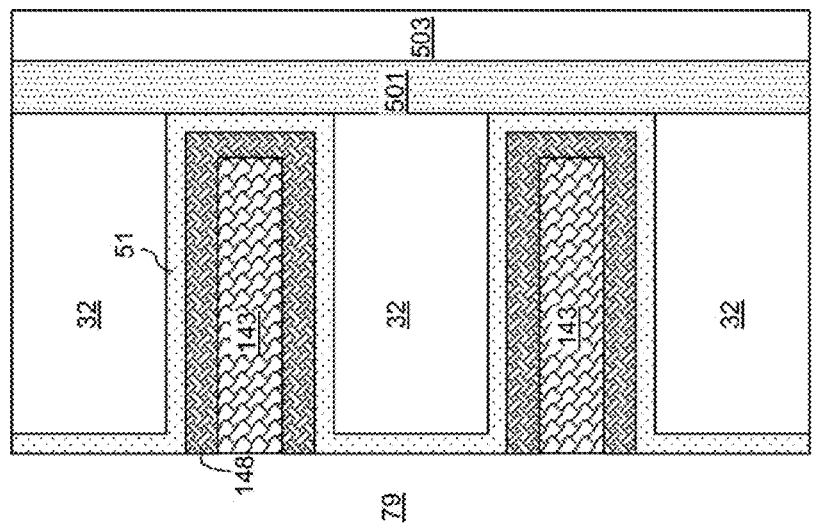

Referring to FIG. 14D, the disposable material portions 143 can be removed by an isotropic etch that etches the material of the disposable material portions 143. A backside cavity 43' can be formed within the volume of each backside recess.

Figure 14E:
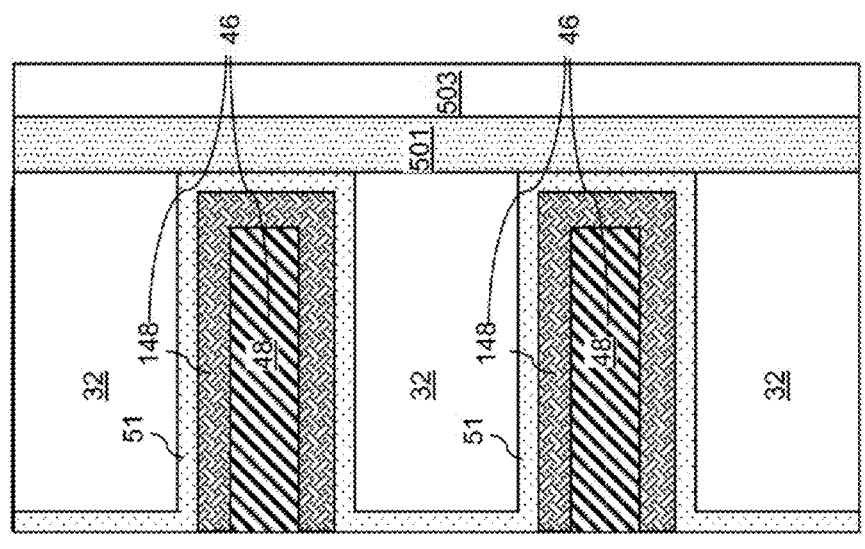

Referring to FIG. 14E, the processing step of FIG. 6C can be performed to form cobalt portions 48. Each cobalt portion 48 is embedded within a metallic barrier material portion 148. Optionally, the processing steps of FIG. 6D may be performed.

A combination of a metallic barrier material portion 148 and a cobalt portion 48 embedded within the metallic barrier material portion 148 constitutes an electrically conductive layer 46 at each level. Thus, each electrically conductive layer 46 can consist of a cobalt portion 48 and a metallic barrier material portion 148. Each electrically conductive layer 46 can be vertically spaced from an overlying insulating layer 32, an underlying insulating layer 32, and the memory film 50 by the backside blocking dielectric layer 51. Each cobalt portion 48 of the electrically conductive layers 46 is formed on surfaces of a respective metallic barrier material portion 148. Specifically, each cobalt portion 48 of the electrically conductive layers 46 is formed on a pair of horizontal surfaces of the respective metallic barrier material portion and an outer sidewall of the respective metallic barrier material portions. The disposable material layer 143L may be used in conjunction with other embodiments.

Figure 15:
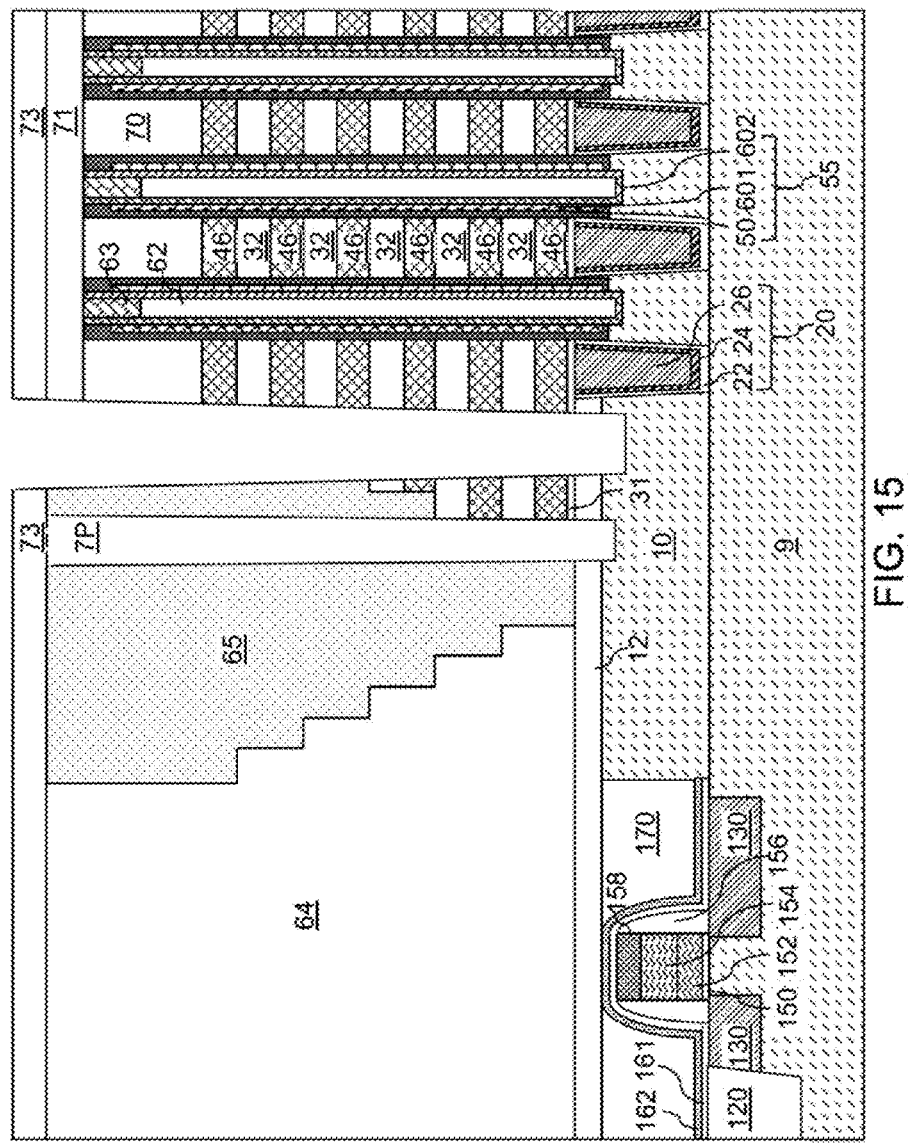
FIG. 15 is a vertical cross-sectional view of the exemplary structure after formation of electrically conductive lines according to an embodiment of the present disclosure.

Referring to FIG. 15, the exemplary structure is shown after formation of a plurality of electrically conductive layers 46, which can be any of the electrically conductive layers 46 according to the first through ninth embodiments as described above.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

Figure 16:
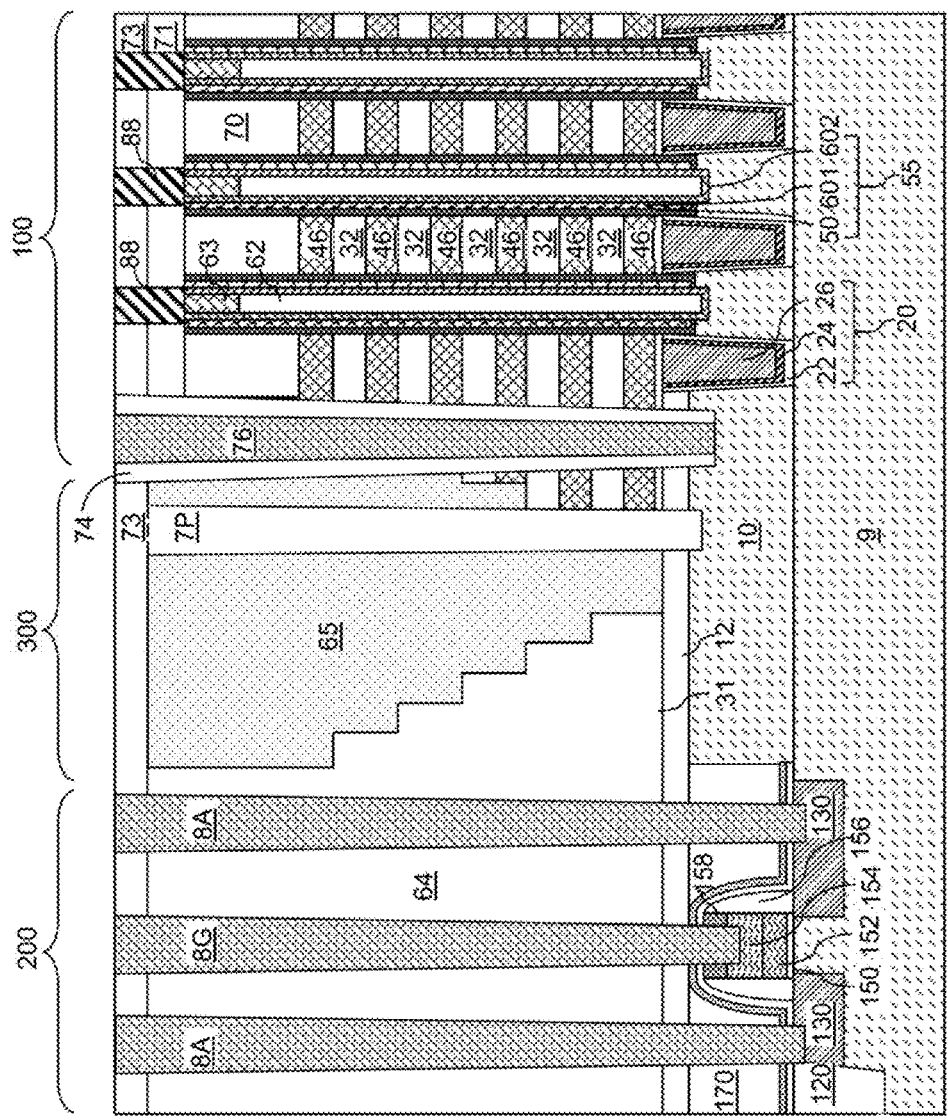
FIG. 16 is a vertical cross-sectional view of the exemplary structure after formation of a backside via space and a backside contact via structure according to an embodiment of the present disclosure.

Referring to FIG. 16, an insulating spacer 74 can be formed on the sidewalls of the backside contact trench 79 by deposition of a contiguous dielectric material layer and an anisotropic etch of its horizontal portions. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

A photoresist layer (not shown) can be applied over the topmost layer of the exemplary structure (which can be, for example, the dielectric pillar material layer 73) and in the cavity laterally surrounded by the insulating spacer 74, and is lithographically patterned to form various openings in a peripheral device region. The locations and the shapes of the various openings are selected to correspond to electrical nodes of the semiconductor devices in the peripheral device region 200 to be electrically contacted by contact via structures. An anisotropic etch is performed to etch through the various layers overlying the electrical nodes of the semiconductor devices. For example, at least one gate via cavity can be formed such that the bottom surface of each gate via cavity is a surface of a gate electrode (152, 154), and at least one active region via cavity can be formed such that the bottom surface of each active region via cavity is a surface of an active region 130. In one embodiment, different types of via cavities can be formed separately employing multiple combinations of photoresist layers and anisotropic etch processes. The vertical extent of each gate via cavity, as measured from the top surface of the dielectric pillar material layer 73 to the bottom surface of the gate via cavity, can be less than the vertical distance between the top surface of the dielectric pillar material layer 73 and the topmost surface of the alternating plurality (32, 46) of the insulator layers 32 and the electrically conductive layers 46. The photoresist layer can be subsequently removed, for example, by ashing.

Another photoresist layer (not shown) can be applied over the exemplary structure, and can be lithographically patterned to form openings within the contact region 200 in which formation of contact via structures for the electrically conductive layers 46 is desired. Control gate contact via cavities can be formed through the retro-stepped dielectric material portion 65 by transfer of the pattern of the opening by an anisotropic etch. Each via cavity can vertically extend to a top surface of a respective electrically conductive layer 46.

In addition, another photoresist layer (not shown) can be applied over the exemplary structure, and can be lithographically patterned to form openings that overlie the array of drain regions 63 in the device region 100. Drain contact via cavities can be formed through the dielectric pillar material layer 73 and the at least one dielectric cap layer 71.

The cavity laterally surrounded by the insulating spacer 74, the various via cavities in the peripheral device region 200, the control gate contact via cavities in the contact region 300, and the drain contact via cavities in the device region 100 can be filled with a conductive material to form various contact via structures. For example, a backside contact via structure 76 can be formed in the cavity surrounded by the insulating spacer 74. A gate contact via structure 8G can be formed in each gate via cavity in the peripheral device region 200. An active region via structure 8A is formed in each active region via cavity in the peripheral device region 200. Drain contact via structures 88 can be formed in the drain contact via cavities in the device region 100. Further, control gate contact via structures (not shown) can be formed within each contact via cavity that extends to a top surface of the electrically conductive layers 46 in the contact region 300. Similarly, drain contact via structures 88 can be formed to provide electrical contact to the drain regions 63.

Figure 17B:
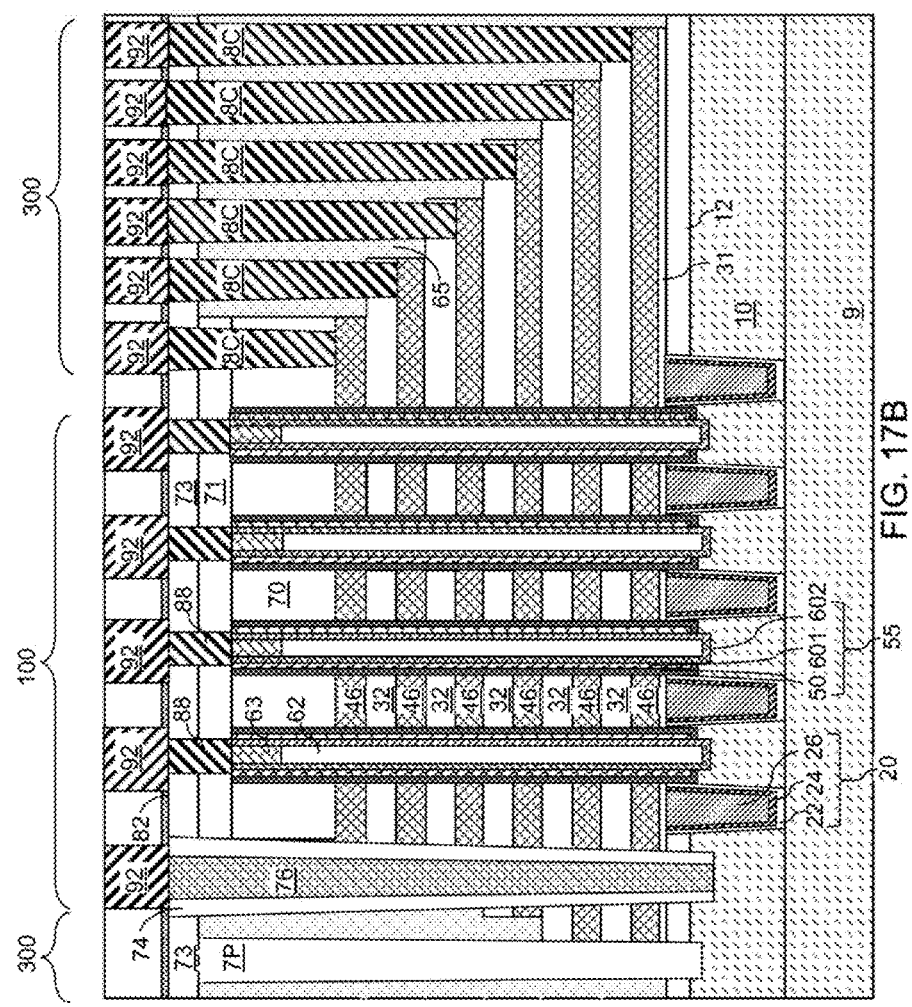

Referring to FIGS. 17A and 17B, an optional passivation layer 82 and a line-level dielectric layer 90 can be formed over the dielectric pillar material layer 73. The optional passivation layer 82 can include a low permeability material such as silicon nitride. The thickness of the passivation layer 82 can be in a range from 3 nm to 30 nm, although lesser and greater thicknesses can also be employed. The line-level dielectric layer 90 can include silicon oxide or organosilicate glass. The thickness of the line-level dielectric layer 90 can be in a range from 30 nm to 1,000 nm, although lesser and greater thicknesses can also be employed. Control gate contact via structures 8C can contact the electrically conductive layers 46.

Various conductive line structures 92 can be formed in the line-level dielectric layer 90 to provide electrical contact to the various contact via structures (76, 8G, 8A, 88, 8C). A subset of the electrically conductive layers 46 can function as control gate electrodes for the memory stack structures 55 in the device region. Optionally, at least one subset of the electrically conductive layers 46 can be employed as at least one drain select gate electrode and/or at least one source select gate electrode.

Additional metal interconnect structures (not shown) can be optionally formed, which can include at least one dielectric material layer, at least one conductive via structure, and at least one additional conductive line structure. The additional metal interconnect structure can be formed on the top surface of the conductive line structure 92 and the line-level dielectric layer 90.

The exemplary structure is a multilevel structure including a stack (32, 46) of an alternating plurality of electrically conductive layers 46 and insulator layers 32 located over a semiconductor substrate including the semiconductor material layer 10. An array of memory stack structures 55 can be located within memory openings through the stack (32, 46).

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels (601, 602). At least one end portion of each of the plurality of semiconductor channels (601, 602) extends substantially perpendicular to a top surface of the semiconductor substrate. The device region 100 further includes a plurality of charge storage regions located within each memory layer 50. Each charge storage region is located adjacent to a respective one of the plurality of semiconductor channels (601, 602). The device region 100 further includes a plurality of control gate electrodes having a strip shape extending substantially parallel to the top surface of the substrate (9, 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 300 including a plurality of electrically conductive contact via structures.

In case the exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 46).

In a non-limiting illustrative example, the insulating layers 32 can comprise silicon oxide layers, the plurality of word lines 46 can comprise tungsten, ruthenium, a combination or an alloy of ruthenium and tungsten, or a combination of titanium nitride, ruthenium, and tungsten, the at least one charge storage region can comprises a tunneling dielectric, a blocking dielectric layer, and either a plurality of floating gates or a charge trapping layer located between the tunneling dielectric layer and the blocking dielectric layer. An end portion of each of the plurality of word lines 46 in a device region can comprise a control gate electrode located adjacent to the at least one charge storage region. A plurality of contact via structures contacting the word lines 46 can be located in a contact region 300. The plurality of word lines 46 extends from the device region 100 to the contact region 300. The backside contact via structure 76 can be a source line that extends through a dielectric insulated trench, i.e., the backside contact trench 79 filled with the dielectric spacer 74 and the backside contact via structure 76, in the stack to electrically contact the source region (not shown). The source region can be in contact with the horizontal portion of the semiconductor channel in an upper portion of the semiconductor material layer 10.

A drain line, as embodied as a conductive line structure 92 that contacts a drain contact via structure 88, electrically contacts an upper portion of the semiconductor channel (601, 602). As used herein, a first element "electrically contacts" a second element if the first element is electrically shorted to the second element. An array of drain regions 63 contacts a respective semiconductor channel (601, 602) within the array of memory stack structures 55. A top surface of the dielectric material layer, i.e., the insulating cap layer 70, can be coplanar with top surfaces of the drain regions 63.

The exemplary structure of the present disclosure can comprise a three-dimensional memory device, which comprises a stack (32, 46) of alternating layers comprising insulator layers 32 and electrically conductive layers 46 and located over a substrate (9, 10), a memory opening extending through the stack (32, 46), and a memory film 50 and a semiconductor channel (601, 602) located within the memory opening. Each of the electrically conductive layers 46 comprises at least a cobalt portion 48. The electrically conductive layers 46 comprise a first control gate electrode located in a first device level, and a second control gate electrode located in a second device level that is located below the first device level.

According to another aspect of the present disclosure, a backside blocking dielectric layer can be formed in the backside recesses 43 prior to deposition of any conductive material that constitutes electrically conductive layers. In this case, the first blocking dielectric and/or the second blocking dielectric can be optionally omitted.

Referring to FIG. 18A, a magnified region M in FIGS. 5A and 5B is illustrated, in which tenth exemplary electrically conductive layers are subsequently formed according to another embodiment of the present disclosure. In this case, the first blocking dielectric 501 and/or the second blocking dielectric 503 can be omitted.

In one embodiment, the first blocking dielectric 501 is omitted, and the second blocking dielectric 503, the charge storage element 504, and the tunneling dielectric 505 are present within each memory film 50. In another embodiment, the second blocking dielectric 503 is omitted, and the first blocking dielectric 501, the charge storage element 504, and the tunneling dielectric 505 are present within each memory film 50. In yet another embodiment, the first blocking dielectric 501 and the second blocking dielectric 503 are omitted, and the charge storage element 504 and the tunneling dielectric 505 are present within each memory film 50. Each insulating layer 32 (i.e., insulator layer 32, which is used interchangeably herein with "insulating layer 32") physically contacts an outer sidewall of a respective memory film 50 around each memory opening. The omission of the first blocking dielectric 501 and/or the second blocking dielectric 503 can be effected by omitting formation of the first blocking dielectric layer 501L and/or by omitting formation of the second blocking dielectric layer 503L.

In still another embodiment, both the first blocking dielectric 501 and the second blocking dielectric 503 can be present within each memory film 50. While the present disclosure is described employing an embodiment in which a first blocking dielectric 501 and a second blocking dielectric 503 are present within each memory film 50, embodiments are expressly contemplated herein in which the first blocking dielectric 501 and/or the second blocking dielectric 503 are omitted from each memory film 50.

The exemplary structure illustrated in FIG. 18A can be provided by forming a stack of alternating layers comprising insulating layers 32 and sacrificial material layers 42 over a substrate 10, and forming memory openings 49 through the stack employing the processing steps of FIG. 1, forming a memory stack structure 55 comprising at least one charge storage element 504, a tunneling dielectric 505, and a vertical semiconductor channel 60 within each memory opening 49 employing the processing steps of FIGS. 2A-2F, by forming a backside contact trench 79 through the alternating stack of the insulating layers 32 and the sacrificial material layers 42, and by removing the sacrificial material layers 42 by introduction of an etchant through the backside contact trench 79 employing the processing steps of FIGS. 5A and 5B. As discussed above, the removal of the sacrificial material layers 42 can be performed selective to the insulating layers 32 and the outermost material of the memory film 50, which may be the material of the first blocking dielectric 501, the material of the second blocking dielectric 503, or the material of the charge storage element 504 (which may be embodied as a continuous charge trapping material layer or discrete floating gate material portions). Thus, a sidewall of the memory film 50 is physically exposed at each backside recess 43.

Referring to FIG. 18B, an optional backside blocking dielectric layer 51 is formed directly on a sidewall of the memory stack structure 55. Specifically, the backside blocking dielectric layer 51 is formed on the physically exposed sidewalls and horizontal surfaces of the insulating layers 32 and on the physically exposed surfaces of the memory film 50, which can be a sidewall of the first blocking dielectric 501, a sidewall of the second blocking dielectric 503 in case the first blocking dielectric is not present, or a sidewall of the charge storage element 504 in case the first and second blocking dielectrics (501, 503) are not present. The backside blocking dielectric layer 51 is formed within the backside recesses 43 prior to formation of electrically conductive layers.

The backside blocking dielectric layer 51 includes a dielectric material, which can be a dielectric metal oxide. In one embodiment, the backside blocking dielectric layer 51 can include a dielectric metal oxide having a dielectric constant greater than 7.9, i.e., having a dielectric constant greater than the dielectric constant of silicon nitride. Non-limiting examples of dielectric metal oxides that can be employed for the backside blocking dielectric layer 51 include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The backside blocking dielectric layer 51 can be deposited, for example, by chemical vapor deposition (CVD), atomic layer deposition (ALD), pulsed laser deposition (PLD), liquid source misted chemical deposition, or a combination thereof. The thickness of the backside blocking dielectric layer 51 can be in a range from 1 nm to 20 nm, although lesser and greater thicknesses can also be employed. The backside blocking dielectric layer 51 can subsequently function as a dielectric material portion that blocks leakage of stored electrical charges to control gate electrodes. In one embodiment, the backside blocking dielectric layer 51 includes aluminum oxide. In case the first blocking dielectric 501 and/or the second blocking dielectric 503 are present, the backside blocking dielectric layer 51 can comprise the same material as, or can comprise a different material from, the material(s) of the first blocking dielectric 501 and/or the second blocking dielectric 503.

Referring to FIG. 18C, an optional metallic barrier material layer 148L can be deposited in the backside recesses 43 and over the sidewall of the backside contact trench 79. The metallic barrier material layer 148L includes a metallic barrier material, which is a metallic material that blocks diffusion of metal elements therethrough. The metallic barrier material layer 148L can be a conductive metallic nitride layer such as TiN, TaN, WN, or a combination or an alloy thereof. The thickness of the metallic barrier material layer 148L can be in a range from 0.5 nm to 1.5 nm, although lesser and greater thicknesses can also be employed. The metallic barrier material layer 148L can be deposited directly on the physically exposed surfaces of the backside blocking dielectric layer 51, for example, by chemical vapor deposition (CVD) or atomic layer deposition (ALD). In general, the thickness of the metallic barrier material layer 148L can be thinner if cobalt is to be subsequently deposited on the sidewalls of the metallic barrier material layer 148L than if tungsten is to be subsequently deposited on the sidewalls of the metallic barrier material layer 148L. A backside cavity 43' is present in each unfilled volume of the backside recess 43, i.e., in each volume of the backside recess 43 that is not filled with the metallic barrier material layer 148L.

Referring to FIG. 18D, cobalt can be deposited inside the backside cavities 43' and in the backside contact trench 79 to form a cobalt layer 48L. The cobalt layer 48L may be a cobalt metal layer. In an embodiment, the cobalt metal layer 48L consists essentially of cobalt and unavoidable impurities and excludes cobalt nitride or Group IV compounds of cobalt, such as cobalt silicide, germanide or carbide. Deposition of the cobalt layer 48L can be performed by chemical vapor deposition (CVD) or atomic layer deposition (ALD). Chemical vapor deposition or atomic layer deposition of cobalt employs a cobalt precursor that can be easily vaporized to leave high-purity cobalt on a surface without causing surface damage. In one embodiment, an organometallic compound with relatively high vapor pressures and good thermal stability can be employed as the cobalt precursor gas to deposit cobalt without requiring hydrogen. In a non-limiting example, bis(cyclopentadienyl)cobalt, bis(ethylcyclopentadienyl)cobalt, bis(methylcyclopentadienyl)cobalt, or bis(pentamethylcyclopentadienyl)cobalt can be employed as a cobalt precursor gas in a CVD or ALD process. Alternatively, different precursor gases (such as $Co_2(CO)_8$) can also be employed for cobalt deposition.

Since the metallic barrier material layer 148L functions as a nucleation layer for cobalt deposition, the cobalt layer 48L can be formed on the entire physically exposed surfaces of the metallic barrier material layer 148L. The cobalt layer 48L can have a substantially uniform thickness throughout. As used herein, a "substantially uniform thickness" refers to a thickness that does not deviate from the average thickness by more than 10% throughout the entire portions of an element. The duration of the cobalt deposition process can be selected such that the cobalt layer 48L does not fill the entire volume of each backside cavity 43' as provided after formation of the metallic barrier material layer 148L. For example, the cobalt layer 48L can have a thickness in a range from 2 nm to 15 nm, although lesser and greater thicknesses can also be employed. A backside cavity 43' of a reduced volume is present between each vertically neighboring pair of insulating layers 32 after formation of the cobalt layer 48L.

Figure 18F:
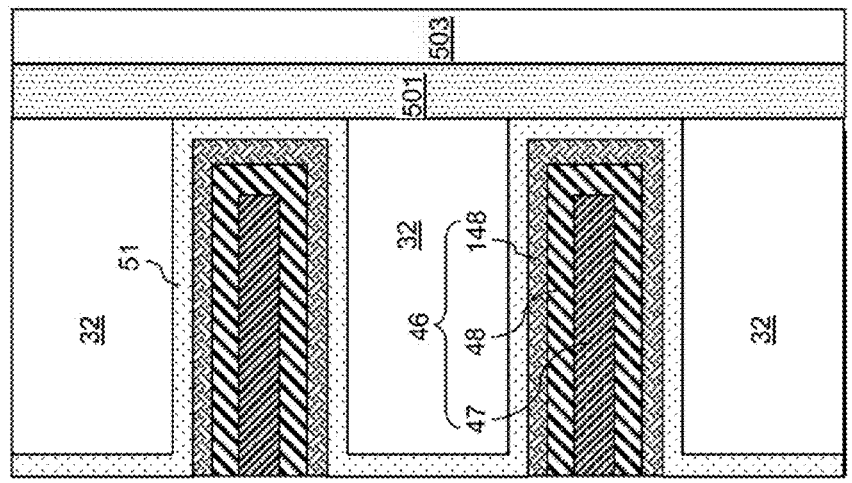
Figure 18E:
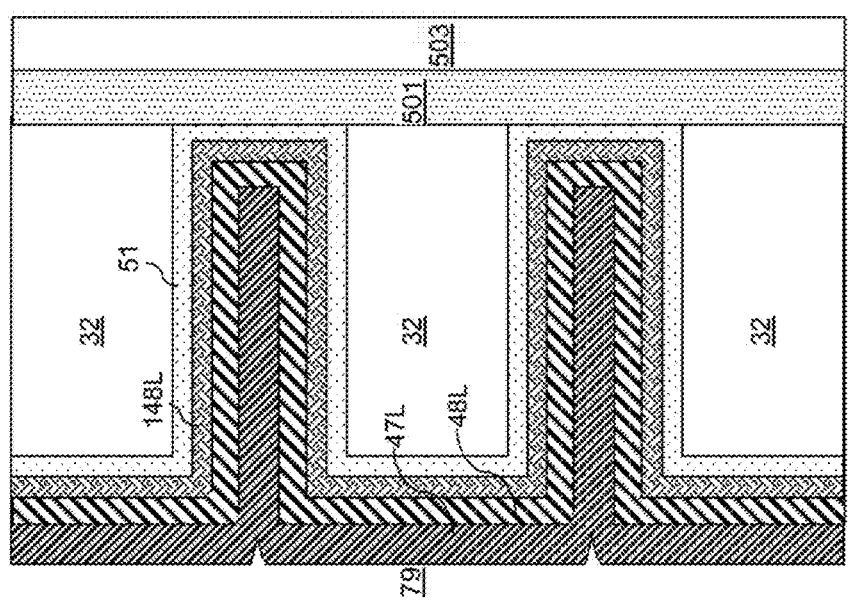

Referring to FIG. 18E, a metallic material layer 47L is deposited in the backside cavities 43' and at a peripheral region of the remaining cavity in the backside contact trench 79. The metallic material layer 47L is deposited directly on the physically exposed surfaces of the cobalt layer 48L. The metallic material layer 47L can include any metallic material other than cobalt reduces or prevents cobalt migration and resulting voids in the cobalt. In one embodiment, the metallic material layer 47L can consist essentially of a single elemental metal or an intermetallic alloy of at least two elemental metals. For example, the metallic material layer 47L can comprise molybdenum, tungsten, ruthenium, or a combination thereof. In one embodiment, the metallic material layer 47L can comprise tungsten or a tungsten-containing intermetallic alloy. The thickness of the metallic material layer 47L can be selected such that the backside cavities 43' are completely filled with the metallic material layer 47L.

In one embodiment, the metallic material layer 47L can include a material that can retard thermal migration or electromigration of cobalt atoms during subsequent processing steps and/or during operation of the memory device employing the memory stack structure 55. In one embodiment, the metallic material layer 47L can include a material having a melting point at 1 atmospheric pressure of greater than 2,000 degrees Celsius. Generally speaking, bulk diffusion of atoms at an elevated temperature is less for elements having high melting temperature. Thus, use of a material having a melting point at 1 atmospheric pressure of greater than 2,000 degrees Celsius can be effective in retarding thermal migration of electromigration of cobalt, which has a melting temperature of 1,495 degrees Celsius. In one embodiment, the metallic material layer 47L can include a material selected from tungsten, molybdenum, ruthenium, and intermetallic alloys thereof. Melting points of tungsten, molybdenum, and ruthenium are 3,422 degrees Celsius, 2,623 degrees Celsius, and 2,334 degrees Celsius, respectively. In some embodiments, the metallic material layer 47L may have horizontal divots or seams at each level between a vertically neighboring pair of insulating layers 32.

Referring to FIG. 18F, vertical portions of the metallic material layer 47L, vertical portions of the cobalt layer 48L, and vertical portions of the metallic barrier material layer 148L are sequentially removed from the periphery of each backside contact trench 79 employing at least one etch process. The at least one etch process can include an isotropic etch process or an anisotropic etch process. The at least one etch process can include multiple etch chemistries that are optimized to remove the respective materials of the metallic material layer 47L, the cobalt layer 48L, and the metallic barrier material layer 148L. In case at least one anisotropic etch is employed for removal of the vertical portions of the metallic material layer 47L, the cobalt layer 48L, and the metallic barrier material layer 148L, remaining portions of the metallic material layer 47L, the cobalt layer 48L, and the metallic barrier material layer 148L can have vertically coincident sidewalls, which may be vertically coincident with an outer sidewall of the backside blocking dielectric layer 51. Optionally, the remaining portions of the metallic material layer 47L, the cobalt layer 48L, and the metallic barrier material layer 148L may be laterally recessed toward a most proximal memory stack structure 55 from the vertical plane including the outer sidewall of the backside blocking dielectric layer 51.

Vertical portions of the metallic material layer 47L can be removed prior to removing the vertical portions of the cobalt layer 48L, and vertical portions of the cobalt layer 48L can be removed prior to removing the vertical portions of the metallic barrier material layer 148L. Each remaining portion of the metallic barrier material layer 148L constitutes a metallic barrier material portion 148. Each remaining portion of the cobalt layer 48L constitutes a cobalt portion 48. The cobalt portion 48 may be a cobalt metal portion. In an embodiment, the cobalt metal portion 48 consists essentially of cobalt and unavoidable impurities and excludes cobalt nitride or Group IV compounds of cobalt, such as cobalt silicide, germanide or carbide. Each remaining portion of the metallic material layer 47L constitutes a metallic material portion 47. Each adjoining set of a metallic material portion 47, a cobalt portion 48, and a metallic barrier material portion 148 constitutes an electrically conductive layer 46.

Within each electrically conductive layer 46, a metallic material portion 47 is embedded in a cobalt portion 48, and the cobalt portion 48 is embedded in a metallic barrier material portion 148. Each metallic material portion 47 is formed directly on horizontal surfaces and a vertical surface of the cobalt portion 48 in the same electrically conductive layer 46. Each cobalt portion 48 is formed directly on horizontal surfaces and a vertical surface of the metallic barrier material portion 148 in the same electrically conductive layer 46. Each metallic material portion 47 comprises a metal other than cobalt, and contacts a respective cobalt portion 48.

Each of the cobalt portions 48, metallic barrier material portions 148, and the backside blocking dielectric layer 51 can have a substantially uniform thickness throughout. Each metallic barrier material portion 148 can be vertically spaced from the insulating layers 32 by horizontal portions of the backside blocking dielectric layer 51, and can be laterally spaced from the memory film 55 by a vertical portion of the backside blocking dielectric layer 51. Each cobalt portion 48 can be vertically and laterally spaced from the backside blocking dielectric layer 51 by the metallic barrier material portion 148 within the same electrically conductive layer 46. Each metallic material portion 47 can be vertically and laterally spaced from the metallic barrier material portion 148 in the same electrically conductive layer 46 by the cobalt portion 48 of the same electrically conductive layer 46.

The metallic material portions 47 can include a material having a melting point at 1 atmospheric pressure of greater than 2,000 degrees Celsius. In one embodiment, the metallic material portions 47 can include a material selected from tungsten, molybdenum, ruthenium, and intermetallic alloys thereof to retard thermal migration or electromigration of cobalt in the cobalt portions 48 during subsequent processing steps and/or during operation of the semiconductor device including the memory stack structures 55. Each metallic material portion 47 is formed directly on horizontal surfaces and a vertical surface of a respective cobalt portion 48.

The processing steps of FIGS. 18C-18F form tenth exemplary electrically conductive layers 46 within the backside recesses 43. Each of the tenth exemplary electrically conductive layers 46 is formed by forming at least a cobalt portion 48, and specifically, a combination of a metallic barrier material portion 148, a cobalt portion 48, and a metallic material portion 47, within a respective backside recess 43. The metallic barrier material layer 148L is patterned to form the metallic barrier material portions 148, and the cobalt portions 48 are formed on a respective metallic barrier material portion 148. Each vertically neighboring pair of an electrically conductive layer 46 and an insulating layer 32 is vertically spaced from each other by a portion of the backside blocking dielectric layer 51. Each electrically conductive layer 46 is laterally spaced form the memory stack structure 55 by a respective vertical portion of the backside blocking dielectric layer 51.

Figure 19C:
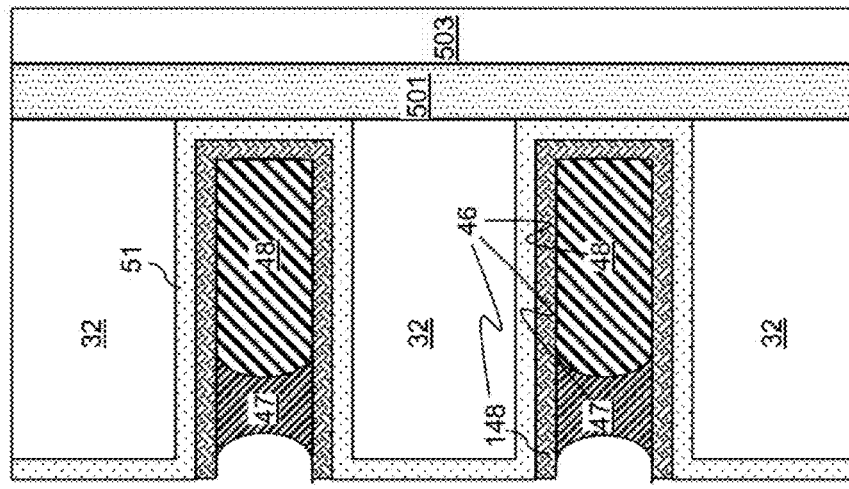

FIGS. 19A-19C illustrate a sequence of processing steps that can be employed to form eleventh exemplary electrically conductive layers 46 according to an embodiment of the present disclosure.

Referring to FIG. 19A, the exemplary structure of FIG. 19A can be derived from the exemplary structure of FIG. 18D by performing an anneal at an elevated temperature. The anneal at the elevated temperature induces thermally induced self-agglomeration of the cobalt material in the cobalt layer 48L into available volumes of the backside recesses, which are volumes defined by the metallic barrier material layer 148L. The volumes of the backside recesses as defines by the metallic barrier material layer 148L enable the thermally migrated cobalt material to form a shape that reduces the surface area of the thermally migrated cobalt material. Each agglomerated portion of the cobalt material forms a cobalt portion 48, which can be provided at each level of the backside recesses, i.e., at each level between a vertically neighboring pair of insulating layers 32. The cobalt portion 48 may be a cobalt metal portion. In an embodiment, the cobalt metal portion 48 consists essentially of cobalt and unavoidable impurities and excludes cobalt nitride or Group IV compounds of cobalt, such as cobalt silicide, germanide or carbide.

The process parameters of the anneal process that induces self-agglomeration of the cobalt material of the cobalt layer 48L can be optimized to avoid formation of voids in the cobalt portions 48, while ensuring removal of the cobalt material from within the volume of the backside contact trench 79. In an illustrative embodiment, the temperature of the anneal process can be selected in a range from 550 degrees Celsius to 950 degrees Celsius. In one embodiment, the temperature of the anneal process can be in a range from 650 degrees Celsius to 900 degrees Celsius, and may be in a range from 750 degrees Celsius to 850 degrees Celsius, although lower and higher temperatures can also be employed depending on duration and the ambient gas employed for the anneal process. The anneal process may be performed in vacuum, in a reduced pressure (lower than the atmospheric pressure), at atmospheric pressure, or in a pressurized environment. Optionally, an inert ambient gas such as argon or nitrogen may be employed. The cobalt portions 48 are formed by agglomeration of the material in the cobalt layer 48L during the anneal at an elevated temperature.

Prior to agglomeration of the cobalt material, i.e., prior to the anneal process, the cobalt layer 48L includes a pair of physically exposed horizontal surfaces and a physically exposed vertical surface within each backside recess. After agglomeration of the cobalt material in the anneal process, the cobalt portions 48 do not include any physically exposed horizontal surface. Each cobalt portion 48 can include a physically exposed convex sidewall. Without wishing to be bound by a particular theory, it is believed that the curvature of the convex sidewalls of the cobalt portions 48 is induced by surface tension of the agglomerated cobalt material. A backside cavity 43' is present between each vertically neighboring pair of insulating layers 32 outside the convex surface of a respective cobalt portion 48.

Referring to FIG. 19B, a metallic material layer 47L is deposited in the backside cavities 43' and at a peripheral region of the remaining cavity in the backside contact trench 79. The metallic material layer 47L is deposited directly on the convex surfaces of the cobalt portions 48 and physically exposed surfaces of the metallic barrier material layer 148L. The metallic material layer 47L can include any metallic material other than cobalt, as described in the prior embodiment. In one embodiment, the metallic material layer 47L can consist essentially of a single elemental metal or an intermetallic alloy of at least two elemental metals. For example, the metallic material layer 47L can comprise molybdenum, tungsten, ruthenium, or a combination thereof. In one embodiment, the metallic material layer 47L can comprise tungsten or a tungsten-containing intermetallic alloy. The thickness of the metallic material layer 47L can be selected such that the backside cavities 43' are completely filled with the metallic material layer 47L.

In one embodiment, the metallic material layer 47L can include a material that can retard thermal migration or electromigration of cobalt atoms during subsequent processing steps and/or during operation of the memory device employing the memory stack structure 55. In one embodiment, the metallic material layer 47L can include a material having a melting point at 1 atmospheric pressure of greater than 2,000 degrees Celsius. In one embodiment, the metallic material layer 47L can include a material selected from tungsten, molybdenum, ruthenium, and intermetallic alloys thereof. In some embodiments, the metallic material layer 47L may have horizontal divots or seams at each level between a vertically neighboring pair of insulating layers 32.

Referring to FIG. 19C, vertical portions of the metallic material layer 47L and vertical portions of the metallic barrier material layer 148L are sequentially removed from the periphery of each backside contact trench 79 employing at least one etch process. The at least one etch process can include an isotropic etch process or an anisotropic etch process. The at least one etch process can include multiple etch chemistries that are optimized to remove the respective materials of the metallic material layer 47L and the metallic barrier material layer 148L. In case at least one anisotropic etch is employed for removal of the vertical portions of the metallic material layer 47L and the metallic barrier material layer 148L, remaining portions of the metallic material layer 47L and the metallic barrier material layer 148L can have vertically coincident sidewalls, which may be vertically coincident with an outer sidewall of the backside blocking dielectric layer 51. Alternatively, the remaining portions of the metallic material layer 47L can be laterally recessed toward a most proximal memory stack structure 55 from the vertical plane including the outer sidewall of the backside blocking dielectric layer 51.

Vertical portions of the metallic material layer 47L can be removed prior to removing the vertical portions of the metallic barrier material layer 148L. Each remaining portion of the metallic barrier material layer 148L constitutes a metallic barrier material portion 148. Each remaining portion of the metallic material layer 47L constitutes a metallic material portion 47. Each adjoining set of a metallic material portion 47, a cobalt portion 48, and a metallic barrier material portion 148 constitutes an electrically conductive layer 46.

Within each electrically conductive layer 46, the metallic material portion 47 is embedded within the metallic barrier material portion 147, and the cobalt portion 48 is embedded in the metallic barrier material portion 148. The cobalt portion 48 is more proximal to the most proximate memory film 50 than the metallic material portion 47 is to the most proximate memory film 50. Each metallic material portion 47 is formed directly on horizontal surfaces the metallic barrier material portion 148 within the same electrically conductive layer 46, and directly on a convex sidewall surface of the cobalt portion 48 in the same electrically conductive layer 46. Each cobalt portion 48 is formed directly on horizontal surfaces and a vertical surface of the metallic barrier material portion 148 in the same electrically conductive layer 46. Each metallic material portion 47 comprises a metal other than cobalt, and contacts a respective cobalt portion 48.

Each of the metallic barrier material portions 148 and the backside blocking dielectric layer 51 can have a substantially uniform thickness throughout. Each metallic barrier material portion 148 can be vertically spaced from the insulating layers 32 by horizontal portions of the backside blocking dielectric layer 51, and can be laterally spaced from the memory film 55 by a vertical portion of the backside blocking dielectric layer 51. Each cobalt portion 48 can be vertically and laterally spaced from the backside blocking dielectric layer 51 by the metallic barrier material portion 148 within the same electrically conductive layer 46. Each metallic material portion 47 can be laterally spaced from the vertical portion of the metallic barrier material portion 148 in the same electrically conductive layer 46 by the cobalt portion 48 of the same electrically conductive layer 46. Each metallic material portion 47 contacts two horizontal surfaces of the metallic barrier material portion 148 within the same electrically conductive layer 46. Depending on the etching process, each metallic material portion 47 may have a convex or a straight outer sidewall facing the backside contact trench 79.

The metallic material portions 47 can include a material having a melting point at 1 atmospheric pressure of greater than 2,000 degrees Celsius. In one embodiment, the metallic material portions 47 can include a material selected from tungsten, molybdenum, ruthenium, and intermetallic alloys thereof to retard thermal migration or electromigration of cobalt in the cobalt portions 48 during subsequent processing steps and/or during operation of the semiconductor device including the memory stack structures 55. Each metallic material portion 47 is formed directly a convex outer sidewall of a respective cobalt portion 48.

Figure 19D:
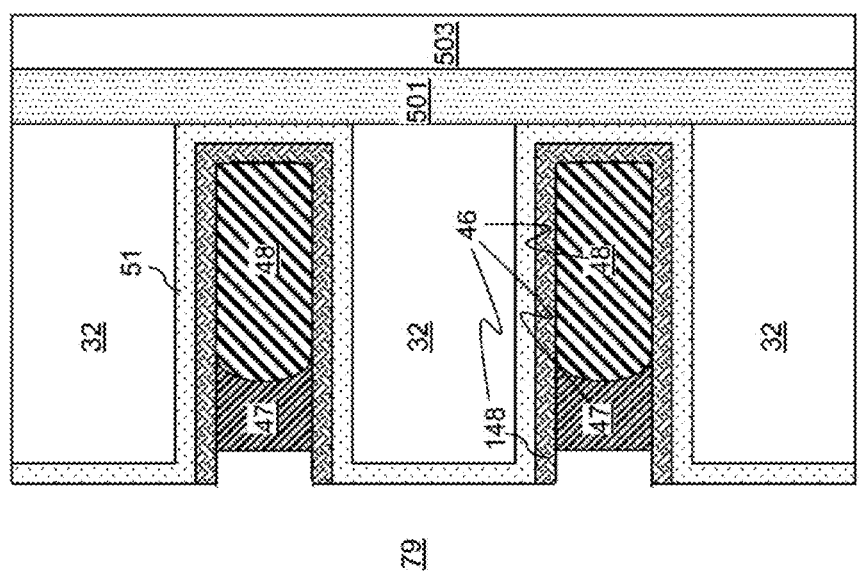
FIG. 19D is a vertical cross-sectional view of a magnified region M in FIGS. 5A and 5B after formation of an alternate embodiment of the eleventh exemplary electrically conductive layers according to an embodiment of the present disclosure.

Referring to FIG. 19D, an alternate embodiment of the eleventh exemplary electrically conductive layers 46 is illustrated. The alternate embodiment of the eleventh exemplary electrically conductive layers 46 according to an embodiment of the present disclosure can be derived from the exemplary structure of FIG. 19B by modifying an etch process employed to remove vertical portions of the metallic material layer 47L and the vertical portions of the metallic barrier material layer 148L. In case horizontal divots are present on the outer surface of the metallic material layer 47L at the processing step of FIG. 19B and if an isotropic etch process is employed to remove vertical portions of the metallic material layer 47L, the metallic material portions 47 (i.e., the remaining portions of the metallic material layer 47L after removal of the vertical portions thereof) can have a concave outer surface. In this case, each metallic material portion 47 can have a concave inner sidewall contacting a convex outer sidewall of a respective cobalt portion 48, a concave outer sidewall that is physically exposed at the processing step of FIG. 19D and is subsequently contacted by a convex portion of a sidewall of an insulating spacer, and two horizontal surfaces that contact a bottom surface and a top surface of the metallic barrier material portion 147 within the same electrically conductive layer 46.

The processing steps of FIG. 19A-19C or 19A, 19B, and 19D form eleventh exemplary electrically conductive layers 46 within the backside recesses 43. Each of the eleventh exemplary electrically conductive layers 46 is formed by forming at least a cobalt portion 48, and specifically, a combination of a metallic barrier material portion 148, a cobalt portion 48, and a metallic material portion 47, within a respective backside recess 43. The metallic barrier material layer 148L is patterned to form the metallic barrier material portions 148, and the cobalt portions 47 are formed on a respective metallic barrier material portion 148. Each vertically neighboring pair of an electrically conductive layer 46 and an insulating layer 32 is vertically spaced from each other by a portion of the backside blocking dielectric layer 51. Each electrically conductive layer 46 is laterally spaced form the memory stack structure 55 by a respective vertical portion of the backside blocking dielectric layer 51.

Vertical portions of the metallic material layer 47L are removed to form metallic material portions 47 after migration of the material of the vertical portions of the cobalt layer 48L during the anneal process that forms the cobalt portions 48. Each metallic material portion 47 is formed on a convex surface of a respective cobalt portion 48 and horizontal surfaces of metallic barrier material portions 148, which are horizontal portions of the metallic barrier material layer 148L.

Figure 20B:
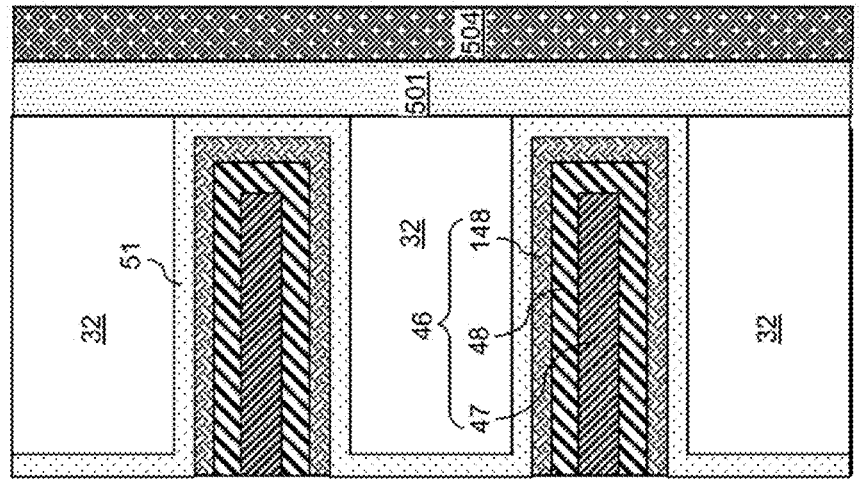
FIGS. 20A-20C are vertical cross-sectional views of modifications of the exemplary structure of FIG. 18F according to embodiments of the present disclosure.
Figure 20A:
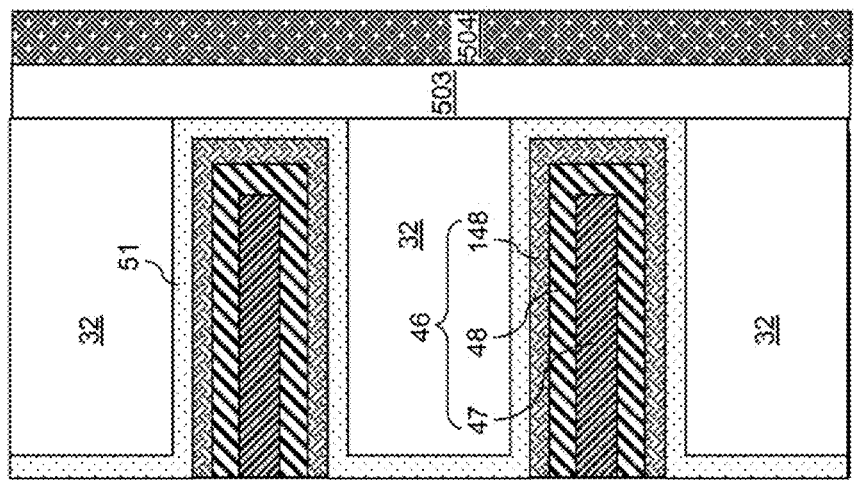
Figure 20C:
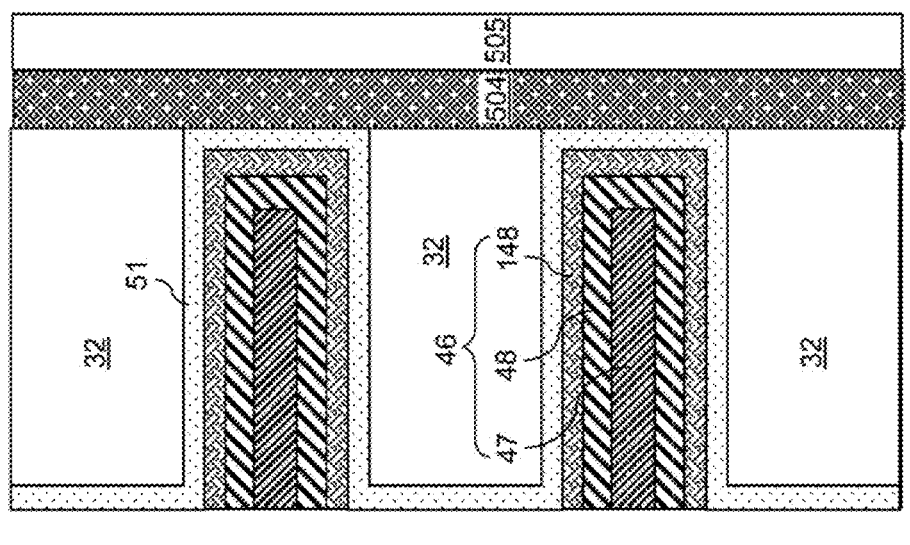

FIGS. 20A-20C illustrate various modifications of the exemplary structure of FIG. 18F according to embodiments of the present disclosure. The structure of FIG. 20A can be derived from the structure of FIG. 18F by omitting formation of the first blocking dielectric 501. In this case, the backside blocking dielectric layer 51 contacts an outer sidewall of the second blocking dielectric 503 at each level of the electrically conductive layers 46. The structure of FIG. 20B can be derived from the structure of FIG. 18F by omitting formation of the second blocking dielectric 503. In this case, the backside blocking dielectric layer 51 contacts an outer sidewall of the first blocking dielectric 501 at each level of the electrically conductive layers 46. The structure of FIG. 20C can be derived from the structure of FIG. 18F by omitting formation of the first blocking dielectric 501 and the second blocking dielectric 503. In this case, the backside blocking dielectric layer 51 contacts an outer sidewall of the charge storage element 504 at each level of the electrically conductive layers 46.

Figure 21B:
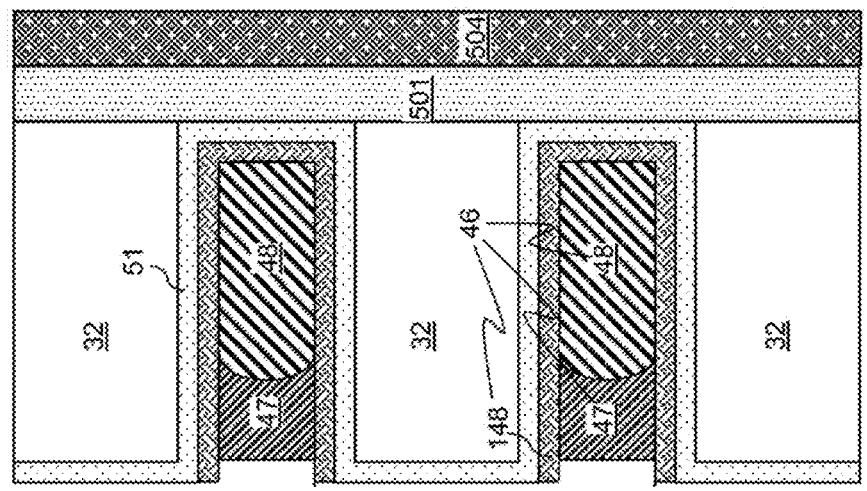
FIGS. 21A-21C are sequential vertical cross-sectional views of modifications of the exemplary structure of FIG. 19D according to an embodiment of the present disclosure.
Figure 21A:
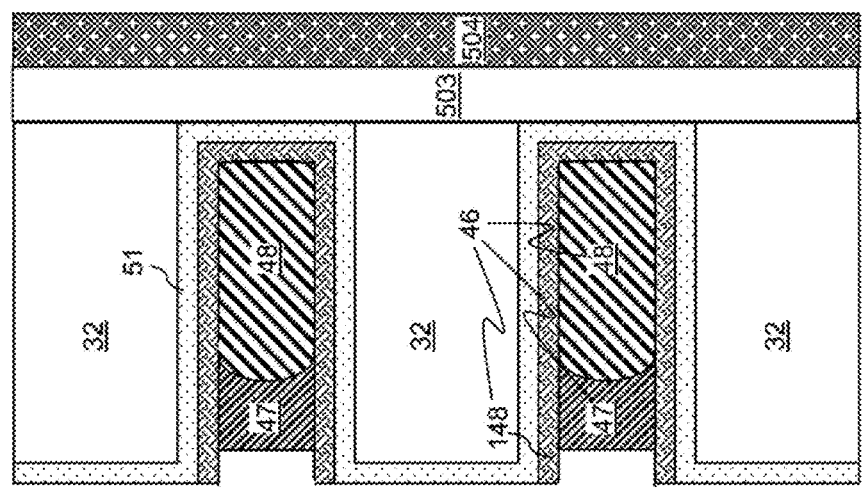
Figure 21C:
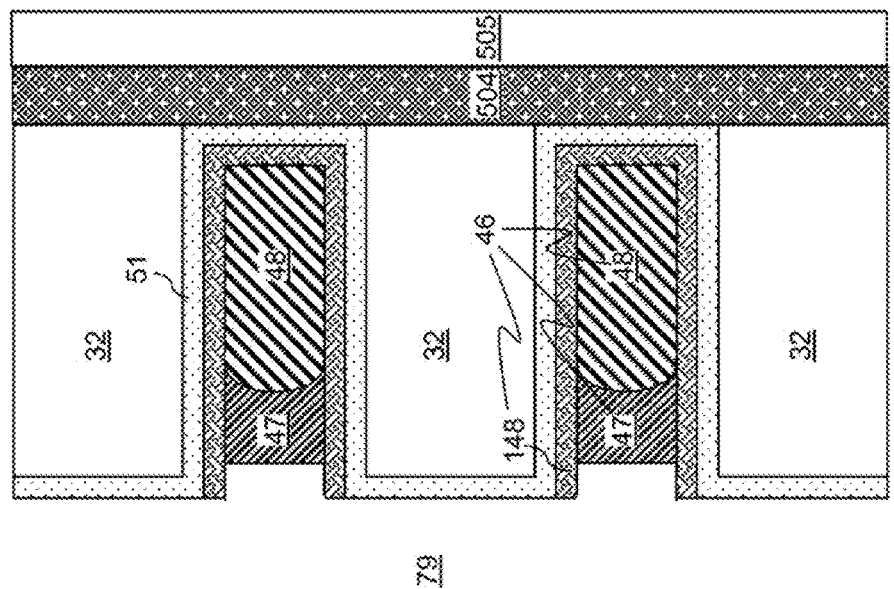

FIGS. 21A-21C illustrate various modifications of the exemplary structure of FIG. 19C according to embodiments of the present disclosure. The structure of FIG. 21A can be derived from the structure of FIG. 19C by omitting formation of the first blocking dielectric 501. In this case, the backside blocking dielectric layer 51 contacts an outer sidewall of the second blocking dielectric 503 at each level of the electrically conductive layers 46. The structure of FIG. 21B can be derived from the structure of FIG. 19C by omitting formation of the second blocking dielectric 503. In this case, the backside blocking dielectric layer 51 contacts an outer sidewall of the first blocking dielectric 501 at each level of the electrically conductive layers 46. The structure of FIG. 21C can be derived from the structure of FIG. 19C by omitting formation of the first blocking dielectric 501 and the second blocking dielectric 503. In this case, the backside blocking dielectric layer 51 contacts an outer sidewall of the charge storage element 504 at each level of the electrically conductive layers 46.

The various electrically conductive layers 46 illustrated in FIGS. 18F, 19C, 19D, 20A-20C, and 21A-21C can be incorporated into the exemplary structure illustrated in FIGS. 15, 16, 17A, and 17B to provide a three-dimensional memory device. Such as three-dimensional memory device can include a stack of alternating layers comprising insulator layers 32 and electrically conductive layers 46 and located over a substrate (9, 10); a memory opening 49 extending through the stack (32, 46), and a memory stack structure 55 comprising at least one charge storage element 504, a tunneling dielectric 505, and a vertical semiconductor channel 60 and is located within the memory opening 49. Each of the electrically conductive layers 46 can comprises at least a cobalt metal portion 48.

In one embodiment, a backside blocking dielectric layer 51 can be provided, which includes horizontal portions located between each vertically neighboring pair of an insulating layer 32 and an electrically conductive layer 46 within the stack of alternating layers (32, 46). In one embodiment, the backside blocking dielectric layer 51 can further include vertical portions adjoining a respective vertically neighboring pair of horizontal portions of the backside blocking dielectric layer 51 and contacting a sidewall of the memory stack structure 55. In one embodiment, each of the electrically conductive layers 46 can further include a metallic barrier material portion 148 contacting a respective pair of horizontal portions of the backside blocking dielectric layer 51.

In one embodiment, the three-dimensional memory device can include a backside contact via structure 76 extending through a backside contact trench 79 in the stack (32, 46), electrically isolated from the electrically conductive layers 46 (for example, by an insulating spacer 74), and contacting a source region 61 located in the substrate (9, 10). A proximal sidewall of each cobalt portion 48 can be laterally spaced from a respective vertical portion of the backside blocking dielectric layer 51 by a vertical portion of a respective metallic barrier material portion 148. Each cobalt portion 48 can be laterally recessed from the backside contact trench 79.

In one embodiment, each cobalt portion 48 can contact a surface of a respective metallic barrier material portion 148. In one embodiment, each cobalt portion 48 can contact a pair of horizontal surfaces of the respective metallic barrier material portion 148 and an outer sidewall of the respective metallic barrier material portion 148 as illustrated in FIGS. 18F and 20A-20C.

In one embodiment, each of the electrically conductive layers 46 can include a metallic material portion 47 containing a material other than cobalt and contacting a respective cobalt portion. In one embodiment, each of the electrically conductive layers 46 can include a metallic barrier material portion 148 contacting the backside blocking dielectric layer 51 and the cobalt portion 48. In one embodiment, the metallic material portion 47 can be laterally and vertically spaced from the metallic barrier material portion 148 by the cobalt portion 48 as illustrated in FIGS. 18F and 20A-20C.

In one embodiment, the metallic material portion 47 can contact the metallic barrier material portion 148 as illustrated in FIGS. 19C, 19D, and 21A-21C. In one embodiment, a concave surface of the metallic material portion 47 can contact a convex surface of the cobalt portion 48.

In one embodiment, the metallic material portion 47 can include a material having a melting point at 1 atmospheric pressure of greater than 2,000 degrees Celsius. In one embodiment, the metallic material portion 47 can include a material selected from tungsten, molybdenum, ruthenium, and intermetallic alloys thereof.

In one embodiment, the three-dimensional memory device can include a vertical NAND device located in a device region. The electrically conductive layers 46 comprise, or are electrically connected to, a respective word line of the vertical NAND device. The device region can include a plurality of semiconductor channels 60, wherein at least one end portion of each of the plurality of semiconductor channels 60 extends substantially perpendicular to a top surface of the substrate (9, 10). The device region can further include a plurality of charge storage regions (as embodied as portions of the charge storage element 504 located at levels of the electrically conductive layers 46). Each charge storage region can be located adjacent to a respective one of the plurality of semiconductor channels 60. The device region can include a plurality of control gate electrodes (as embodies as portions of the electrically conducive layers 46) having a strip shape extending substantially parallel to the top surface of the substrate (9, 10).

In one embodiment, the plurality of control gate electrodes can include at least a first control gate electrode located in a first device level and a second control gate electrode located in a second device level. The electrically conductive layers 46 in the stack (32, 46) can be in electrical contact with the plurality of control gate electrode, and can extend from the device region to a contact region including the plurality of electrically conductive via connections as embodied as control gate contact via structures 8C illustrated in FIG. 17B. The substrate (9, 10) can comprise a silicon substrate containing a driver circuit for the vertical NAND device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A three-dimensional memory device comprising:
a stack of alternating layers comprising insulator layers and electrically conductive layers and located over a substrate;
a memory opening extending through the stack; and a memory stack structure comprising at least one charge storage element, a tunneling dielectric, and a vertical semiconductor channel and is located within the memory opening,
wherein each of the electrically conductive layers comprises a cobalt metal portion consisting essentially of cobalt, a metallic material portion containing a material other than cobalt which comprises tungsten, molybdenum or ruthenium, and directly contacting the cobalt metal portion, and a metallic barrier material portion directly contacting the cobalt metal portion and the metallic material portion.

2. The three-dimensional memory device of claim 1, further comprising a backside blocking dielectric layer comprising horizontal portions located between each vertically neighboring pair of an insulating layer and an electrically conductive layer within the stack of alternating layers.

3. The three-dimensional memory device of claim 2, wherein the backside blocking dielectric layer further comprises vertical portions adjoining a respective vertically neighboring pair of horizontal portions of the backside blocking dielectric layer and contacting a sidewall of the memory stack structure.

4. The three-dimensional memory device of claim 2, wherein the metallic barrier material portion contacts a respective pair of horizontal portions of the backside blocking dielectric layer.

5. The three-dimensional memory device of claim 4, further comprising a backside contact via structure extending through a backside contact trench in the stack, electrically isolated from the electrically conductive layers, and contacting a source region located in the substrate.

6. The three-dimensional memory device of claim 5, wherein a proximal sidewall of each cobalt metal portion is laterally spaced from a respective vertical portion of the backside blocking dielectric layer by a vertical portion of a respective metallic barrier material portion, and each cobalt metal portion is laterally recessed from the backside contact trench.

7. The three-dimensional memory device of claim 4, wherein each cobalt metal portion contacts a surface of a respective metallic barrier material portion.

8. The three-dimensional memory device of claim 4, wherein each cobalt metal portion contacts a pair of horizontal surfaces of the respective metallic barrier material portion and an outer sidewall of the respective metallic barrier material portion.

9. The three-dimensional memory device of claim 2, wherein the metallic barrier material portion directly contacts the backside blocking dielectric layer.

10. The three-dimensional memory device of claim 9, wherein the metallic material portion contacts the metallic barrier material portion, and wherein a concave surface of the metallic material portion contacts a convex surface of the cobalt metal portion.

11. The three-dimensional memory device of claim 1, wherein the metallic material portion comprises a material having a melting point at 1 atmospheric pressure of greater than 2,000 degrees Celsius.

12. The three-dimensional memory device of claim 11, wherein the metallic material portion comprises a tungsten-containing intermetallic alloy.

13. The three-dimensional memory device of claim 1, wherein:
the three-dimensional memory device comprises a vertical NAND device located in a device region;
the electrically conductive layers comprise, or are electrically connected to, a respective word line of the vertical NAND device;
the device region comprises:
a plurality of semiconductor channels, wherein at least one end portion of each of the plurality of semiconductor channels extends substantially perpendicular to a top surface of the substrate;
a plurality of charge storage regions, each charge storage region located adjacent to a respective one of the plurality of semiconductor channels; and
a plurality of control gate electrodes having a strip shape extending substantially parallel to the top surface of the substrate;
the plurality of control gate electrodes comprise at least a first control gate electrode located in a first device level and a second control gate electrode located in a second device level;
the electrically conductive layers in the stack are in electrical contact with the plurality of control gate electrodes and extend from the device region to a contact region including a plurality of electrically conductive via connections; and
the substrate comprises a silicon substrate containing a driver circuit for the vertical NAND device.

14. The three-dimensional memory device of claim 1, wherein the metallic material portion consists essentially of a single elemental metal or an intermetallic alloy of at least two elemental metals.

15. The three-dimensional memory device of claim 14, wherein the metallic barrier material portion is a portion of a conductive metallic nitride.

16. The three-dimensional memory device of claim 14, wherein the metallic barrier material portion is a TiN portion, a TaN portion, a WN portion, or a combination thereof.

17. The three-dimensional memory device of claim 14, wherein:
a concave surface of the metallic material portion directly contacts a convex surface of the cobalt metal portion;
a horizontal surface of the cobalt portion directly contacts the metallic barrier material portion; and
a horizontal surface of the metallic material portion directly contacts the barrier material portion.

* * * * *